US012608532B2

(12) United States Patent
Grudanov et al.

(10) Patent No.: US 12,608,532 B2
(45) Date of Patent: Apr. 21, 2026

(54) PHYSICAL VERIFICATION WORKFLOW FOR SEMICONDUCTOR CIRCUIT DESIGNS

(71) Applicant: SILVACO, INC., Santa Clara, CA (US)

(72) Inventors: Nikolay Grudanov, Kyiv (UA); Valery Bobovsky, Kyiv (UA); Igor Lopanenko, Kyiv (UA); Yuri Levsky, Kyiv (UA); Alexander Grudanov, Kyiv (UA)

(73) Assignee: SILVACO, INC., Santa Clara, CA (US)

( * ) Notice: Subject to any disclaimer, the term of this patent is extended or adjusted under 35 U.S.C. 154(b) by 667 days.

(21) Appl. No.: 18/027,896

(22) PCT Filed: Sep. 23, 2021

(86) PCT No.: PCT/US2021/051816
§ 371 (c)(1),
(2) Date: Mar. 22, 2023

(87) PCT Pub. No.: WO2022/066952
PCT Pub. Date: Mar. 31, 2022

(65) Prior Publication Data
US 2023/0334216 A1     Oct. 19, 2023

Related U.S. Application Data

(60) Provisional application No. 63/081,985, filed on Sep. 23, 2020.

(51) Int. Cl.
*G06F 30/31* (2020.01)
*G06F 30/398* (2020.01)

(52) U.S. Cl.
CPC ............ *G06F 30/398* (2020.01); *G06F 30/31* (2020.01)

(58) Field of Classification Search
USPC ........ 716/50, 51, 54, 55, 110, 111, 115, 118
See application file for complete search history.

(56) References Cited

U.S. PATENT DOCUMENTS 8,407,646 B2     3/2013   Chandramohan et al.
8,713,507 B1 *   4/2014   Noice ..................... G06F 30/39
                                                      716/113

(Continued)

OTHER PUBLICATIONS

International Search Report for International Application PCT/US21/51816 Jan. 20, 2022.

(Continued)

*Primary Examiner* — Brian Ngo
(74) *Attorney, Agent, or Firm* — William Nuttle

(57)     ABSTRACT

An electronic design automation (EDA) tool and system for physical verification of workflow for semiconductor circuit designs, and methods of using the same is described. Generally, the method includes (i) automatic splitting an integrated circuit (IC) layout into a number of windows for parallel processing using a plurality of central processing cores; (ii) extracting parasitic capacitance structures from the IC layout; (iii) generating fill elements for masks to fabricate an IC having the IC layout using a metadata matrix to minimize volume of information and resources needed; and (iv) extraction of parasitic resistance structures from IC layout. In some embodiments, the IC layout is additionally or alternatively split into groups of rules for processing. Other embodiments are also described.

17 Claims, 23 Drawing Sheets

(56) References Cited

U.S. PATENT DOCUMENTS

| | | | | |
|---|---|---|---|---|
| 8,977,995 | B1 * | 3/2015 | Arora | G06F 30/327 716/108 |
| 9,286,427 | B1 * | 3/2016 | Odabasi | G06F 30/33 |
| 10,181,000 | B1 | 1/2019 | Vardhan et al. | |
| 10,248,747 | B1 | 4/2019 | Mukherjee et al. | |
| 2003/0229875 | A1 * | 12/2003 | Smith | G06F 30/39 716/132 |
| 2003/0237063 | A1 * | 12/2003 | Kauth | G06F 30/398 716/115 |
| 2005/0223347 | A1 * | 10/2005 | Okuaki | G06F 30/33 716/112 |
| 2005/0251771 | A1 * | 11/2005 | Robles | G06F 30/367 716/54 |
| 2013/0279804 | A1 * | 10/2013 | Kilbank | G06T 9/007 382/166 |
| 2017/0140085 | A1 | 5/2017 | McHugh et al. | |
| 2017/0249416 | A1 | 8/2017 | Sendig et al. | |

OTHER PUBLICATIONS

Written Opinion of ISA for International Application PCT/US21/51816 Jan. 20, 2022.
European Search Report Patent Application No. EP 21 87 3459; dated Sep. 25, 2024.
Macpherson K et al., "Parallel Algorithms for VLSI Layout Verification"; Journal of Parallel and Distributed Computing; vol. 36, No. 2; dated Aug. 1, 1996.

* cited by examiner

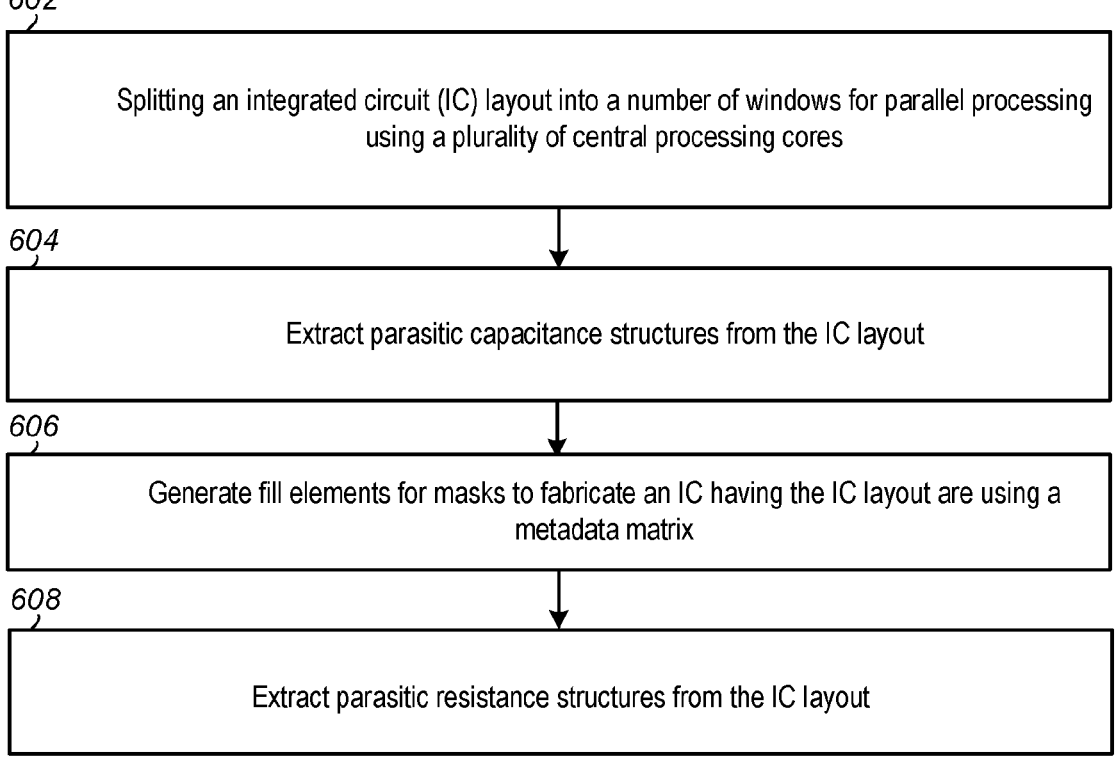

602

Splitting an integrated circuit (IC) layout into a number of windows for parallel processing using a plurality of central processing cores

604

Extract parasitic capacitance structures from the IC layout

606

Generate fill elements for masks to fabricate an IC having the IC layout are using a metadata matrix

608

Extract parasitic resistance structures from the IC layout

FIG. 6

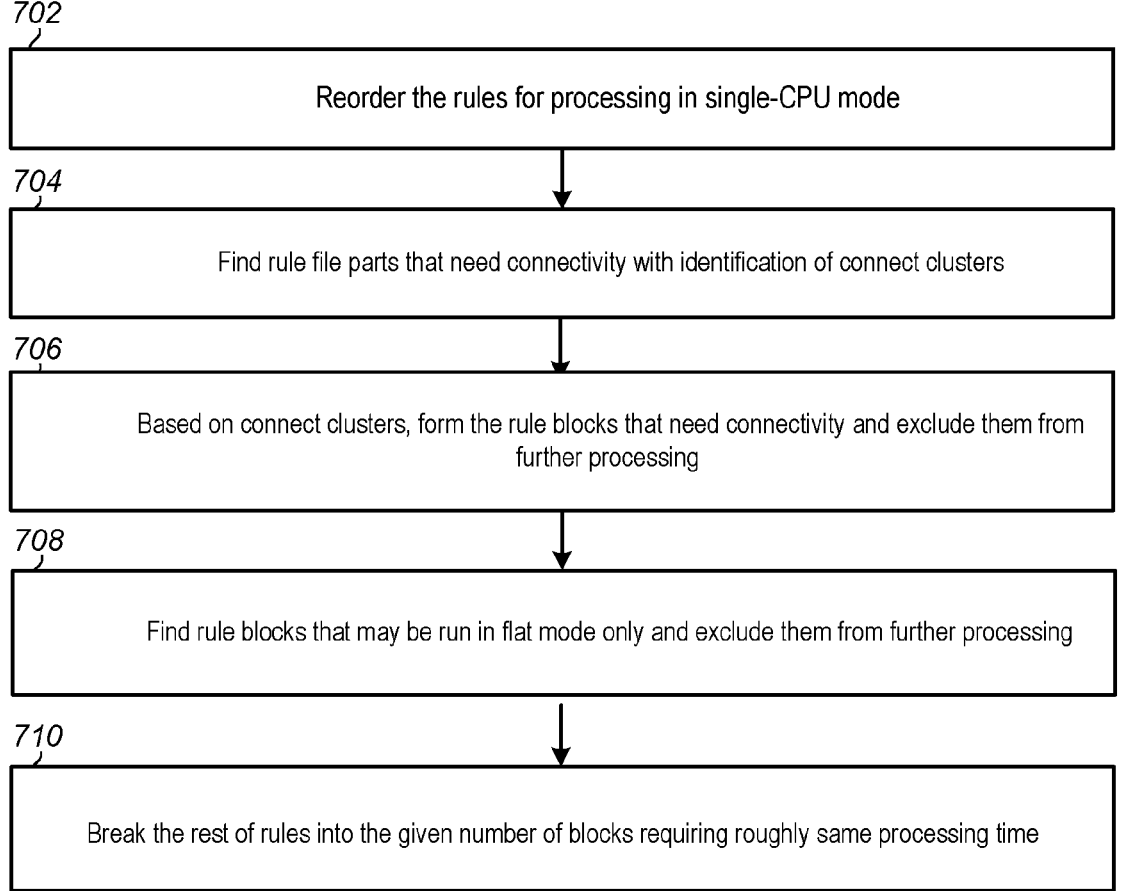

702

Reorder the rules for processing in single-CPU mode

704

Find rule file parts that need connectivity with identification of connect clusters

706

Based on connect clusters, form the rule blocks that need connectivity and exclude them from further processing

708

Find rule blocks that may be run in flat mode only and exclude them from further processing

710

Break the rest of rules into the given number of blocks requiring roughly same processing time

*FIG. 7*

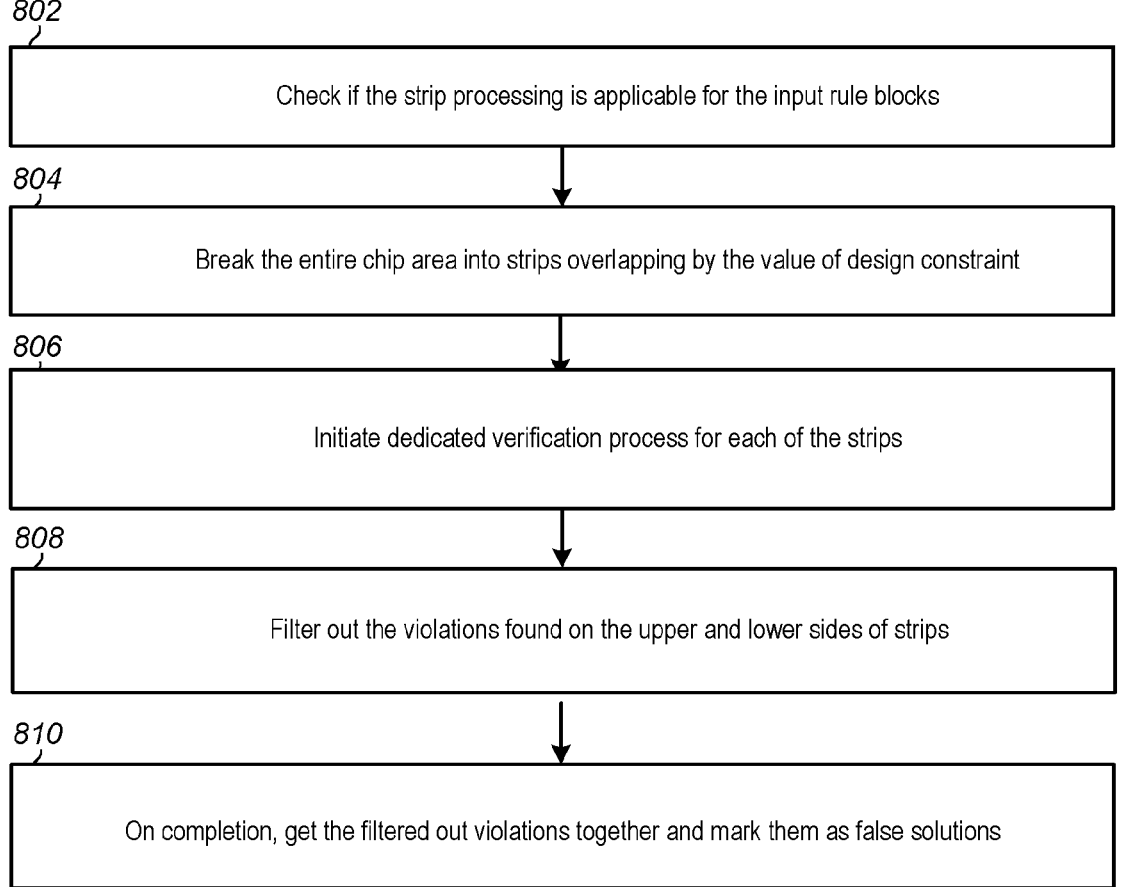

802

Check if the strip processing is applicable for the input rule blocks

804

Break the entire chip area into strips overlapping by the value of design constraint

806

Initiate dedicated verification process for each of the strips

808

Filter out the violations found on the upper and lower sides of strips

810

On completion, get the filtered out violations together and mark them as false solutions

*FIG. 8*

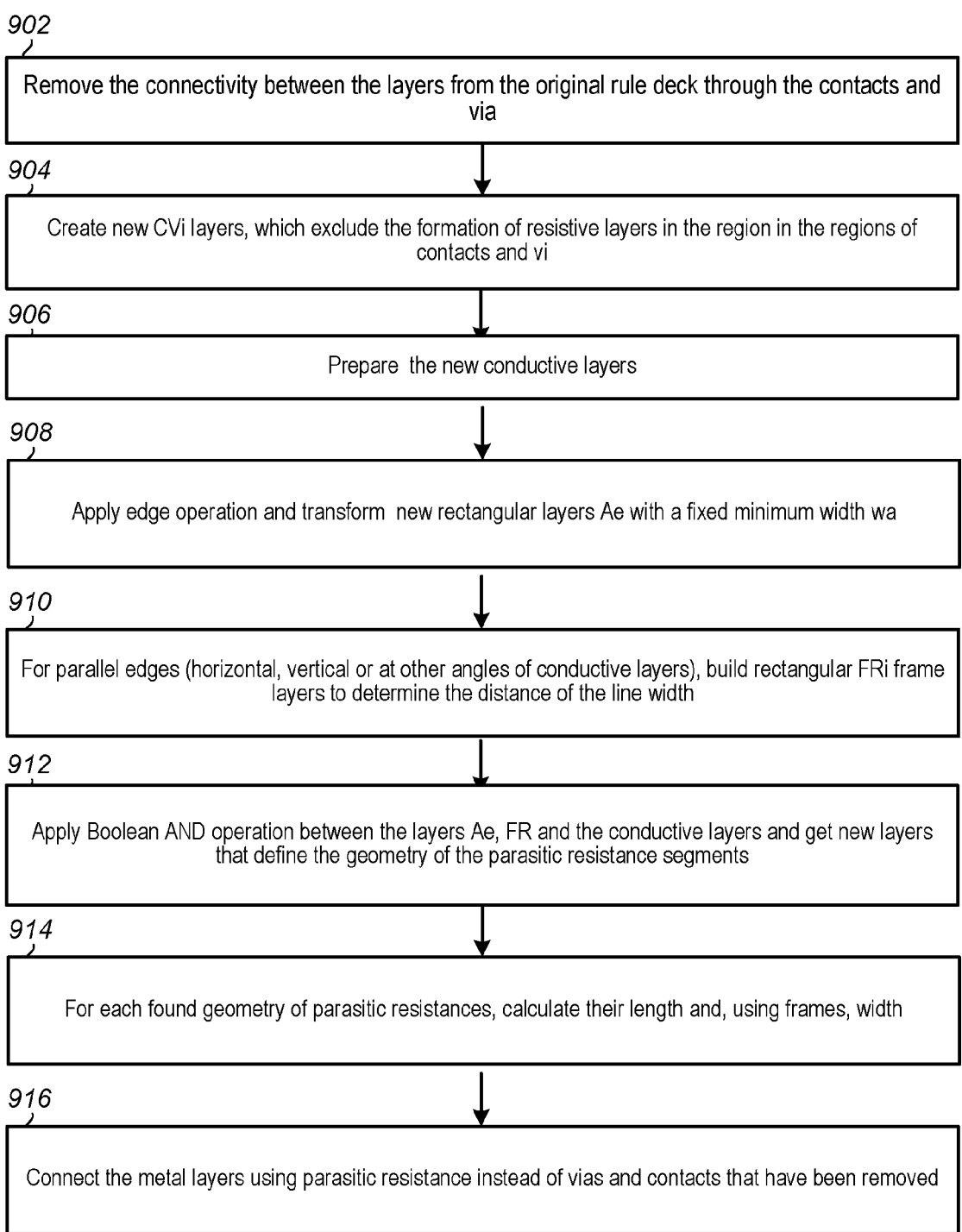

902
Remove the connectivity between the layers from the original rule deck through the contacts and via 904
Create new CVi layers, which exclude the formation of resistive layers in the region in the regions of contacts and vi 906
Prepare the new conductive layers 908
Apply edge operation and transform new rectangular layers Ae with a fixed minimum width wa 910
For parallel edges (horizontal, vertical or at other angles of conductive layers), build rectangular FRi frame layers to determine the distance of the line width 912
Apply Boolean AND operation between the layers Ae, FR and the conductive layers and get new layers that define the geometry of the parasitic resistance segments 914
For each found geometry of parasitic resistances, calculate their length and, using frames, width 916
Connect the metal layers using parasitic resistance instead of vias and contacts that have been removed

*FIG. 9*

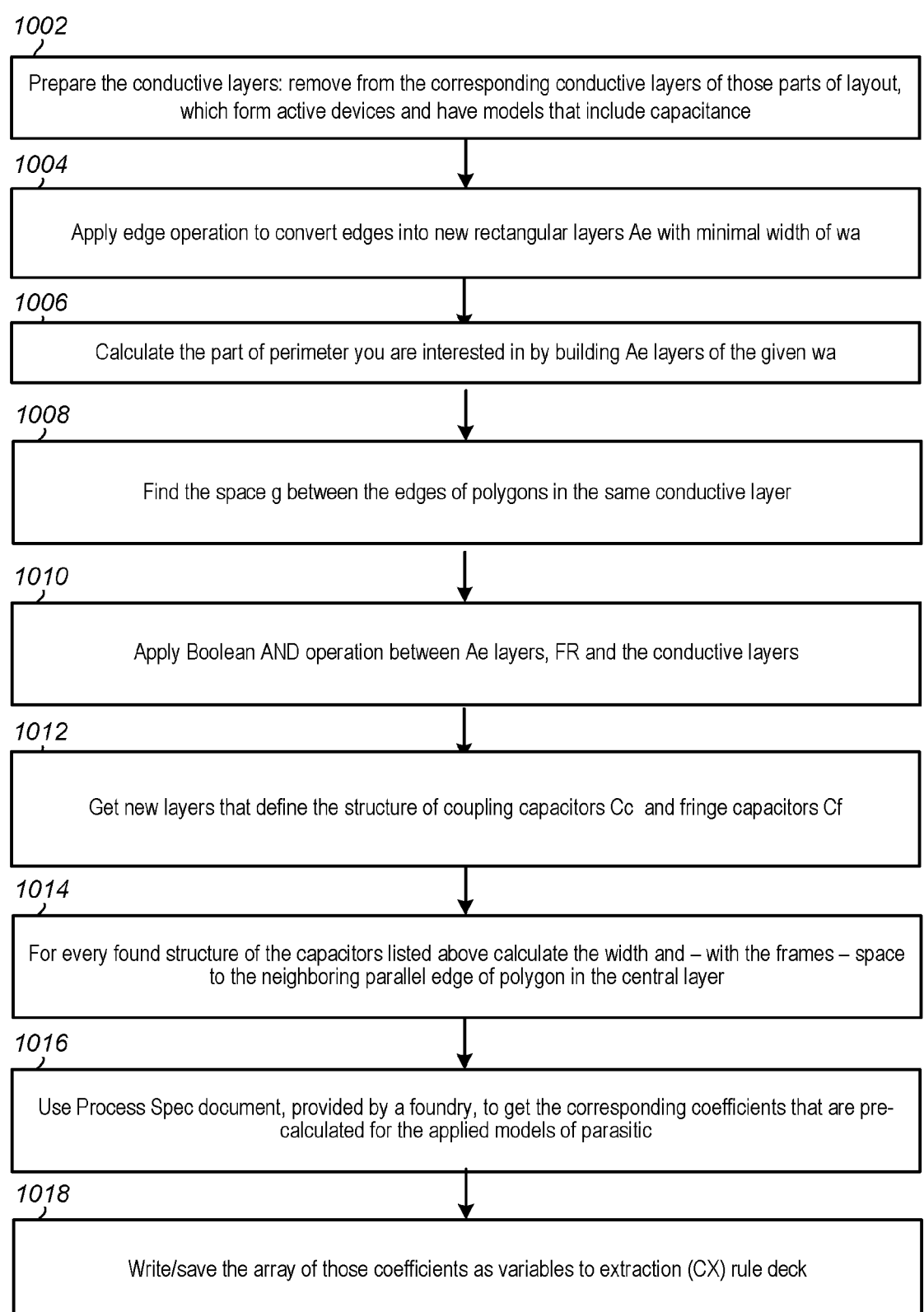

1002

Prepare the conductive layers: remove from the corresponding conductive layers of those parts of layout, which form active devices and have models that include capacitance

1004

Apply edge operation to convert edges into new rectangular layers Ae with minimal width of wa

1006

Calculate the part of perimeter you are interested in by building Ae layers of the given wa

1008

Find the space g between the edges of polygons in the same conductive layer

1010

Apply Boolean AND operation between Ae layers, FR and the conductive layers

1012

Get new layers that define the structure of coupling capacitors Cc and fringe capacitors Cf

1014

For every found structure of the capacitors listed above calculate the width and – with the frames – space to the neighboring parallel edge of polygon in the central layer

1016

Use Process Spec document, provided by a foundry, to get the corresponding coefficients that are pre-calculated for the applied models of parasitic

1018

Write/save the array of those coefficients as variables to extraction (CX) rule deck

*FIG. 10*

PHYSICAL VERIFICATION WORKFLOW FOR SEMICONDUCTOR CIRCUIT DESIGNS

CROSS-REFERENCE TO RELATED APPLICATIONS

This International Application claims the benefit of priority under 35 U.S.C. 119(e) to U.S. Provisional Patent Application Ser. No. 63/081,985, filed Sep. 23, 2020, which is incorporated by reference herein in its entirety.

TECHNICAL FIELD

The present disclosure relates generally to integrated circuit design, and more particularly to electronic design automation (EDA) tools for design, layout and routing of elements in complex integrated circuits.

BACKGROUND

Integrated Circuit (IC) design, specifically, digital IC design, produces components such as microprocessors, FPGAs, memories (RAM, ROM, and flash) and digital ASICs. Digital design focuses on logical correctness, maximizing circuit density, and placing circuits so that clock and timing signals are routed efficiently. Modern ICs are very complicated. An average desktop computer chip may have well over 1 billion transistors. The rules for what can and cannot be manufactured may also be extremely complex. Common IC design processes may include 1000 or more rules. Furthermore, since the manufacturing process itself is not completely predictable, designers have to account for its statistical nature. The complexity of modern IC design, as well as market pressure to produce designs rapidly, has led to the extensive use of automated design tools in the IC design process.

Accordingly, there is a need for a MEMS phased-array and methods for operating the same to provide fast beam steering and large scan angles for use in LiDAR applications.

SUMMARY

The present disclosure generally describes devices, systems, and methods directed to physical verification workflow for semiconductor circuit designs. Specifically, embodiments are described for (A) extraction of parasitic capacitance structures from layout; (B) automatic splitting of integrated circuit layout for parallel processing; (C) use of metadata matrix to minimize volume of information and resources needed for generating fillers for integrated circuit masks; and (D) extraction of parasitic resistance structures from IC layout. A system according to embodiments may be implemented in single-host-multi-core (e.g., single server) or multi-host-multi-core (e.g., cloud-based service) environments.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

Embodiments of the present invention will be understood more fully from the detailed description that follows and from the accompanying drawings and the appended claims provided below, where:

FIG. 6 is a flow chart of a method for physical verification workflow for semiconductor circuit designs;

FIG. 7 is a flow chart of a method for splitting an IC into a number of windows for parallel processing based on an automatic splitting of rules;

FIG. 8 is a flow chart of a method for splitting an IC into a number of strips for parallel processing;

FIG. 9 is a flow chart of a method for extracting parasitic resistance structures from an IC layout; and FIG. 10 is a flow chart of a method for extracting parasitic capacitances from an IC layout.

DETAILED DESCRIPTION

Figure 1A:
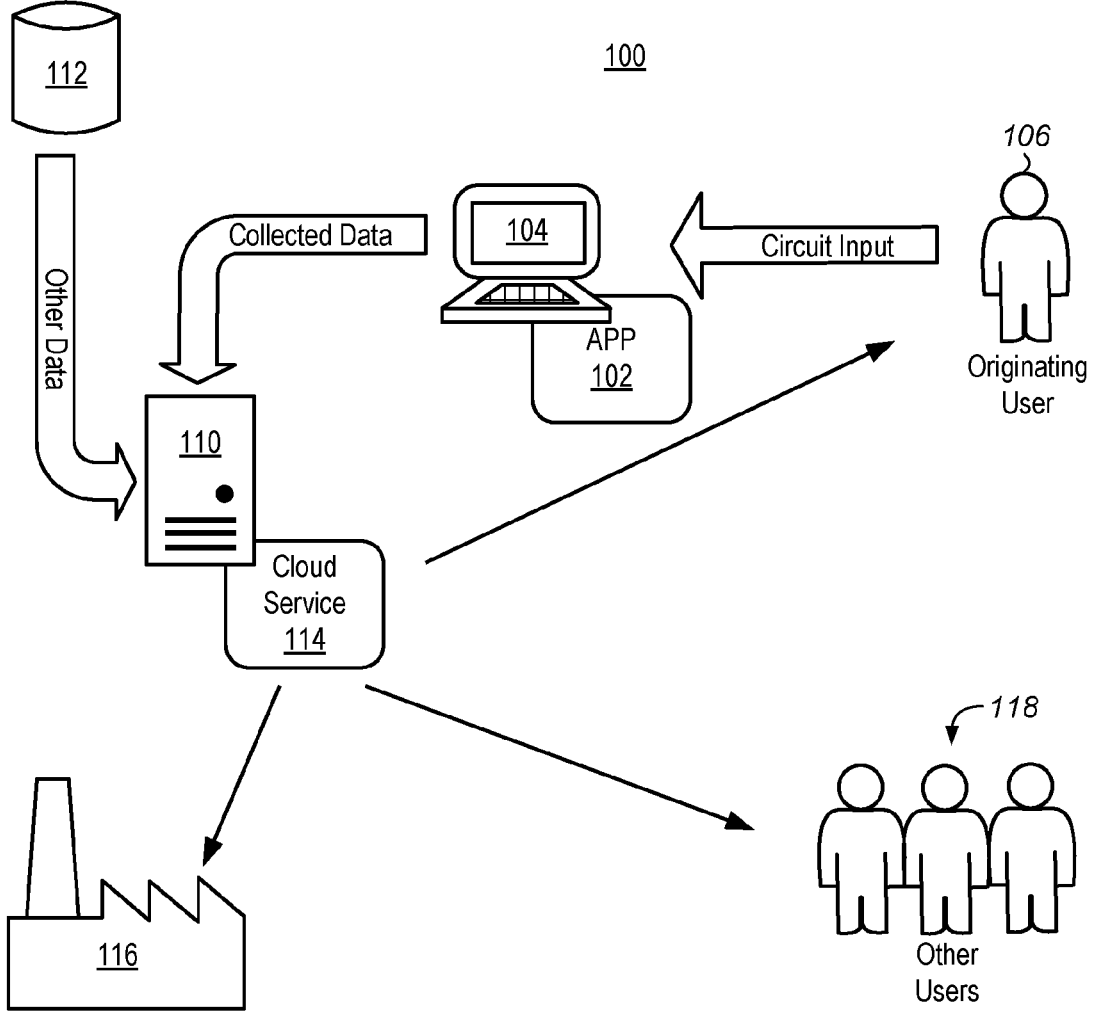
FIG. 1A illustrates a diagram of an example system for physical verification workflow for semiconductor circuit designs.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to devices, systems, and methods directed to physical verification workflow for semiconductor circuit designs. Specifically, embodiments are described for (A) extraction of parasitic capacitance structures from IC layout; (B) automatic splitting of integrated circuit layout for parallel processing; (C) use of metadata matrix to minimize volume of information and resources needed for generating fillers for integrated circuit masks; and (D) extraction of parasitic resistance structures from IC layout.

FIG. 1A illustrates a diagram of an example system for physical verification workflow for semiconductor circuit designs, arranged in accordance with at least some embodiments described herein. Briefly, the system 100 includes an application (APP 102) running on a computing device 104 into which an originating user 106 enters information on a circuit design (circuit input). In accordance with the present disclosure the APP 102 generally includes electronic design automation (EDA) software tools for physical verification workflow of the circuit design. Additionally, the system 100 may further include a server 110 coupled to receive collected data from the computing device 104, and other information (e.g., part characteristics, layout rules, etc.) from a second computing device or memory 112. In some embodiments the EDA software for physical verification workflow of the circuit design may be partly or entirely resident on the server 110. Finally, the server 110 can be coupled through a cloud service 114 to a foundry 116 for fabricating the verified circuit design, as shown in FIG. 1, and to the originating user 106 and other users 118 (e.g., designers, engineers, managers, etc.) to report a layout of the verified circuit design. Alternatively, where security concerns are paramount the verified circuit design can be communicated to the foundry 116 for fabricating by other secure means including via transfer of data stored on physical media.

Physical verification is a process for an integrated circuit (IC) layout design to be verified through electronic design automation software tools to ensure correct electrical and logical functionality and manufacturability. Verification may include, but is not limited to, design rule check (DRC), layout versus schematic (LVS), electrical rule check (ERC), XOR (exclusive OR), and antenna checks. DRC verifies that the layout meets all technology-imposed constraints, for example, layer density for chemical-mechanical polishing (CMP). LVS verifies the functionality of the design. A netlist derived from the layout may be compared with the original netlist produced from logic synthesis or circuit design.

ERC verifies the correctness of power and ground connections, and that signal transition times (slew), capacitive loads, and fanouts are appropriately bounded. ERC may include checking for well and substrate areas for proper contacts and spacings thereby ensuring correct power and ground connections, unconnected inputs or shorted outputs, any gates directly connected to supplies, etc. ERC checks may be based upon assumptions about the normal operating conditions of the IC and may include additional checks such as checks for structures susceptible to electrostatic discharge (ESD) damage.

An XOR check may be typically executed after a metal spin, where the original and modified databases are compared. The XOR check may be used to confirm that the desired modifications have been made and no undesired modifications have been made accidentally, for example. Antenna check test for antenna effect violations. An antenna is essentially a metal interconnect, that is, a conductor like polysilicon or metal, that is not electrically connected to silicon or grounded, during the processing steps of the wafer. During the manufacturing process charge accumulation may occur on the antenna during certain fabrication steps like plasma etching, which uses highly ionized matter to etch. If the connection to silicon does not exist, charges may build up on the interconnect to the point at which rapid discharge does take place and permanent physical damage results to thin transistor gate oxide. This rapid and destructive phenomenon is known as the antenna effect. Antenna errors may be cured by adding a small antenna diode to safely discharge the node or splitting the antenna by routing up to another metal layer and then down again.

A system according to embodiments, an illustrative example of which is shown in FIG. 1A, provides, among other things physical verification of integrated circuit layouts with features such as extraction of parasitic capacitance structures from layout; automatic splitting of integrated circuit layout for parallel processing; using metadata matrix to minimize volume of information and resources needed for generating fillers for integrated circuit masks; and extraction of parasitic resistance and capacitance.

In the example system 100, an originating user 106 may provide circuit input (circuit design) through an application (APP 102) on a computing device 104. A physical verification service may receive the circuit input and other information (e.g., part characteristics, layout rules, etc.) from the second computing device or memory 112 and generate layout reports, which may be provided to a foundry 116 for manufacturing, to the originating user, or to other users 118 such as designers, engineers, managers, etc.

A system according to embodiments may be implemented in single-host-multi-core (e.g., single server 110) or multi-host-multi-core (e.g., cloud-based service) environments. In FIG. 1A, a cloud-based system is shown as an illustrative example. However, where security concerns are paramount the circuit design can be verified on a secure standalone system and the verified design communicated to a foundry for fabricating, and/or to other users such as designers, engineers, managers, etc. for review by other secure means including transfer of data stored on physical media.

The computing device for data collection may be a generic or special purpose computing device such as a desktop computer, a laptop computer, a terminal, a smartphone, a stationary computer, a portable computer, a wearable computing device, a special purpose data collection device, and similar ones. The service may be executed on one or more servers co-located or in different locations.

Figure 1B:
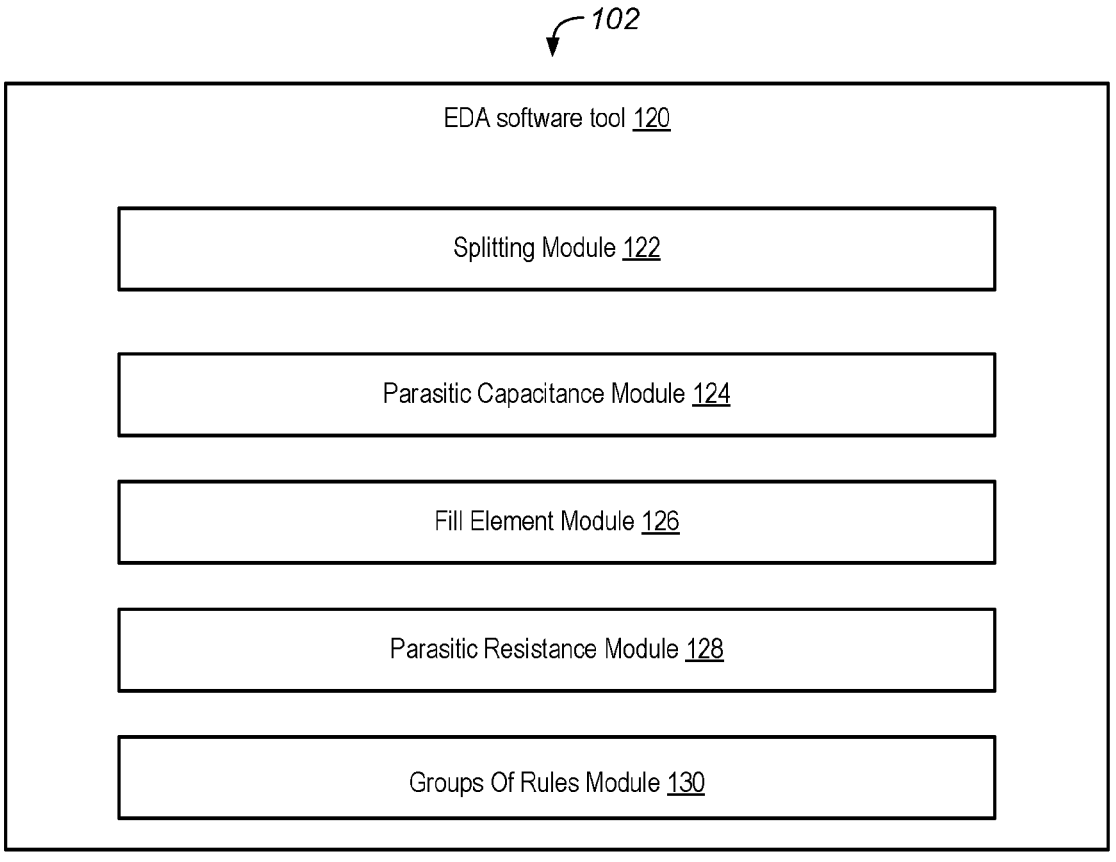
FIG. 1B is a block diagram of the APP of FIG. 1A including an EDA software tool with modules for physical verification workflow of semiconductor circuit designs.

FIG. 1B is a block diagram of the APP 102 of FIG. 1A including an EDA software tool 120 for physical verification workflow of the circuit design. Referring to FIG. 1B it is noted that the EDA software tool 120 includes a splitting module 122 operable to split an IC layout into a number of windows for parallel processing using multiple central processing cores, a parasitic capacitance module 124 operable to extract for each window parasitic capacitance structures from the IC layout, a fill element module 126 operable to generate for each window fill elements for masks to fabricate an IC having the IC layout using a metadata matrix to minimize volume of information and resources needed, and a parasitic resistance module 128 operable to extract for each window parasitic resistance structures from the IC layout. In some embodiments, such as that shown, the EDA software tool 120 further includes a groups of rules module 130 operable to splitting the IC layout into a number of groups of rules for parallel processing using the plurality of central processing cores.

Figure 2A:
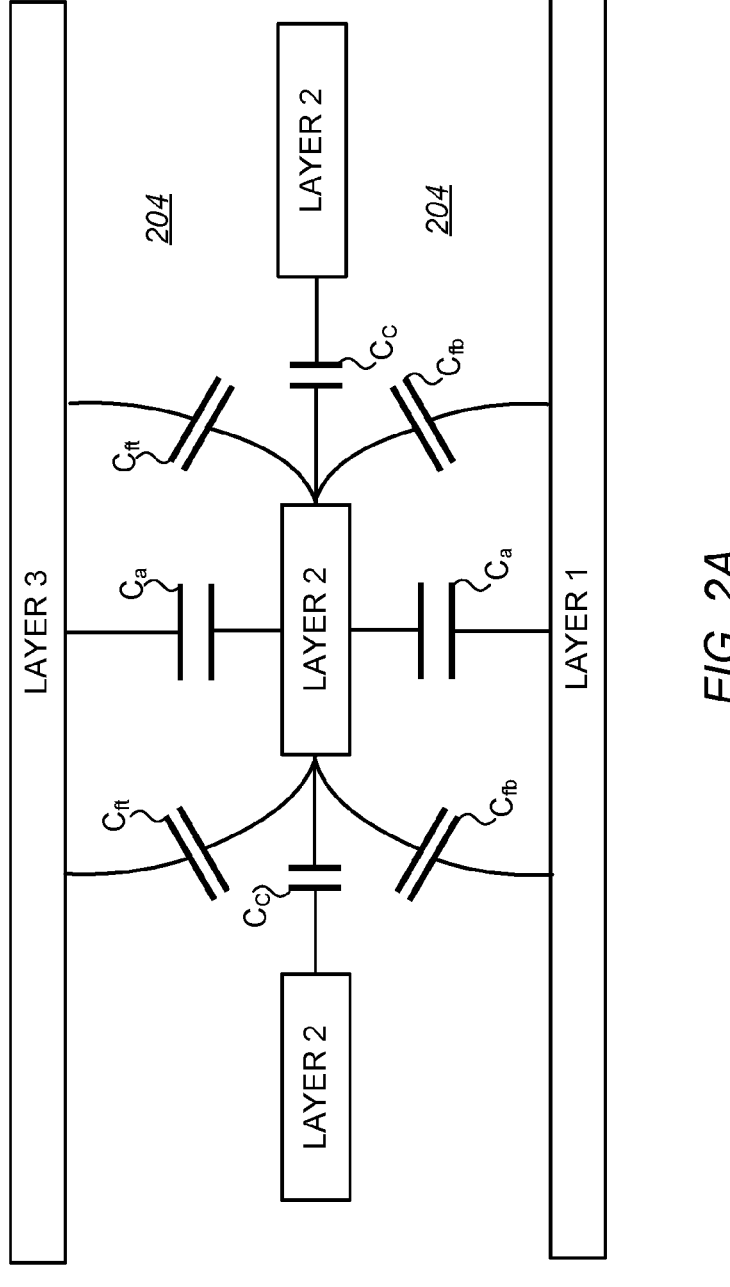
FIG. 2A illustrates a typical structure of combination of conductive layers.

FIG. 2A illustrates a typical structure 202 of combination of conductive layers in a portion of a semiconductor device shown in sectional side view. In particular, FIG. 2A illustrates a first layer (LAYER 1) formed over a surface of a semiconductor substrate, a central conductive layer (LAYER 2) above the first layer and a third layer (LAYER 3) overlying both, all separated by an interlayer dielectric 204.

The capacitance of conducting planes, shown in FIG. 2A, is calculated with analytic models obtained from the analysis of results of two-dimensional (2D) computations. For each conductive plane except active one and substrate, there are three types of capacitance that are calculated: The overlap or area capacitance (Ca), which depends only on the thickness of dielectric between the overlapping conductive planes and the area of overlapping but not on the gap between conductors of the conductive plane if there is one. Such capacitance is considered one-dimensional (1D) as it only depends on the thickness of dielectric. The line-to-line coupling capacitance (Cc), which depends on the space between conductors of one conductive plane and their thickness, and doesn't depend (or weakly depends) on the presence or absence of other conductive planes above or below. Such capacitance is considered one-dimensional (1D) as it only depends on the space between conductors. The model accuracy decreases as the space grows but the capacitance and its influence also decrease. The fringe capacitance (Cf) is formed between the edge of one conductor and the surface of a second conductor above or below the first one (if the perimeter crosses different conductive planes).

Two types of capacitances—coupling capacitance (Cc) and fringe capacitance (Cf)—are extracted from the results of 2D simulation. In the general case, fringe capacitance consists of two parts—Cft (fringe capacitance with top layer) and Cfb (fringe capacitance with bottom layer). Both fringe capacitance and coupling capacitance depend mainly on the space between conductors (g) of the central conductive layer (LAYER 2 in FIG. 2A) for all possible layer combinations on the top and on the bottom (the central layer here is the layer, for which parasitic coupling and fringe capacities are extracted).

The following assumptions confirmed by the results of 2D simulation are used in calculation of Cft, Cfb, and Cc: (1) Coupling capacitance Cc for the minimal allowable values of space between neighboring parallel polygons of the same conductive layer with accuracy about several percent doesn't depend on the presence of conductive layers at the top or at the bottom. As the space between neighboring parallel edges of polygons of the same conductive layer grows, the value of coupling capacitance decreases to different degree depending on what layers are on top or on the bottom. That requires that different coefficients be applied in the model of dependence of coupling capacitance on the space between polygons of the central layer for various combinations of layers on the top and on the bottom. (2) Fringe capacities Cft and Cfb at big spaces between neighboring parallel polygons of the same conductive layer depend only on the combination of conductive layers on the top and on the bottom. As the space between neighboring parallel polygons of the same conductive layer decreases to the minimal value, fringe capacities reduce by a factor of 3 and more.

The task is to find the capacities Cft, Cfb, and Cc formed from the central layer Mx as the width of polygon edge (w) of the layer Mx, at which width the condition of belonging to the group of bottom and top conductive layers, and same space (g) to the edge of neighboring bus of the layer Mx keep constant. With g>gmax, the values of Cft and Cfb capacitances depend only on the bottom/top layer combination provided there is no polygon nearby in the same layer.

Depending on the chosen approximation method and the number of approximation points (from two for gmin and gmax, and more), various models may be used to describe the dependence of coupling and fringe capacities on the space between polygons.

An example process according to embodiments may be as follows:

1) Preliminary preparation of conductive layers consists in removal from the corresponding conductive layers of those parts of layout, which form active devices and have models that include capacitance, e.g. transistors, resistors, capacitors, diodes, etc.

2) Using edge operation in the software tool of choice, convert edges into new rectangular layers Ae with minimal width of wa. The minimal wa width is a given, i.e. known, value that is chosen in a way to minimize distortions in geometric parameters of capacities, e.g. a fraction of the design grid. For a polygon of arbitrary shape one can only calculate directly its area and full perimeter. By building Ae layers of the given wa width you can calculate the part of perimeter you are interested in.

3) For parallel edges (horizontal, vertical or any-angled) of the central conductive layers for the given combination of layers at the top and at the bottom rectangular frames are built to find the space g between the edges of polygons in the same conductive layer. To avoid incorrect calculation of the space at minimal pitches of conductive layers, the frames are built with breakdown into ranges as follows:

$$FR1=d+2*wd-am;$$

$$FRn=d+2*wd-am+(n-1)*(d+wd).$$

where d—the minimal bus width; wd—the minimal space between buses of the same layer, dmin, μm; and am<<d—parameter.

4) With logical AND operation between Ae layers, FR and the layers of conductors on the top and on the bottom build new layers that define the structure of coupling capacitors Cc and fringe capacitors Cf. As the result we get two groups of capacitors. Unlike the second group, the capacitors of the first group have a polygon of the central layer at space<gmax. These two groups require different models for calculation of capacities.

5) For every found structure of the capacitors listed above calculate the width w and—with the frames—space g to the neighboring parallel edge of polygon in the central layer.

6) Based on the data provided by foundry in Process Specification, corresponding coefficients are calculated for the applied models of parasitic capacitances for every possible structure of parasitic capacitance. The array of those coefficients is recorded as variables to extraction (CX) rule deck.

FIG. 2B through 2E illustrate an example scenario.

Figure 2B:
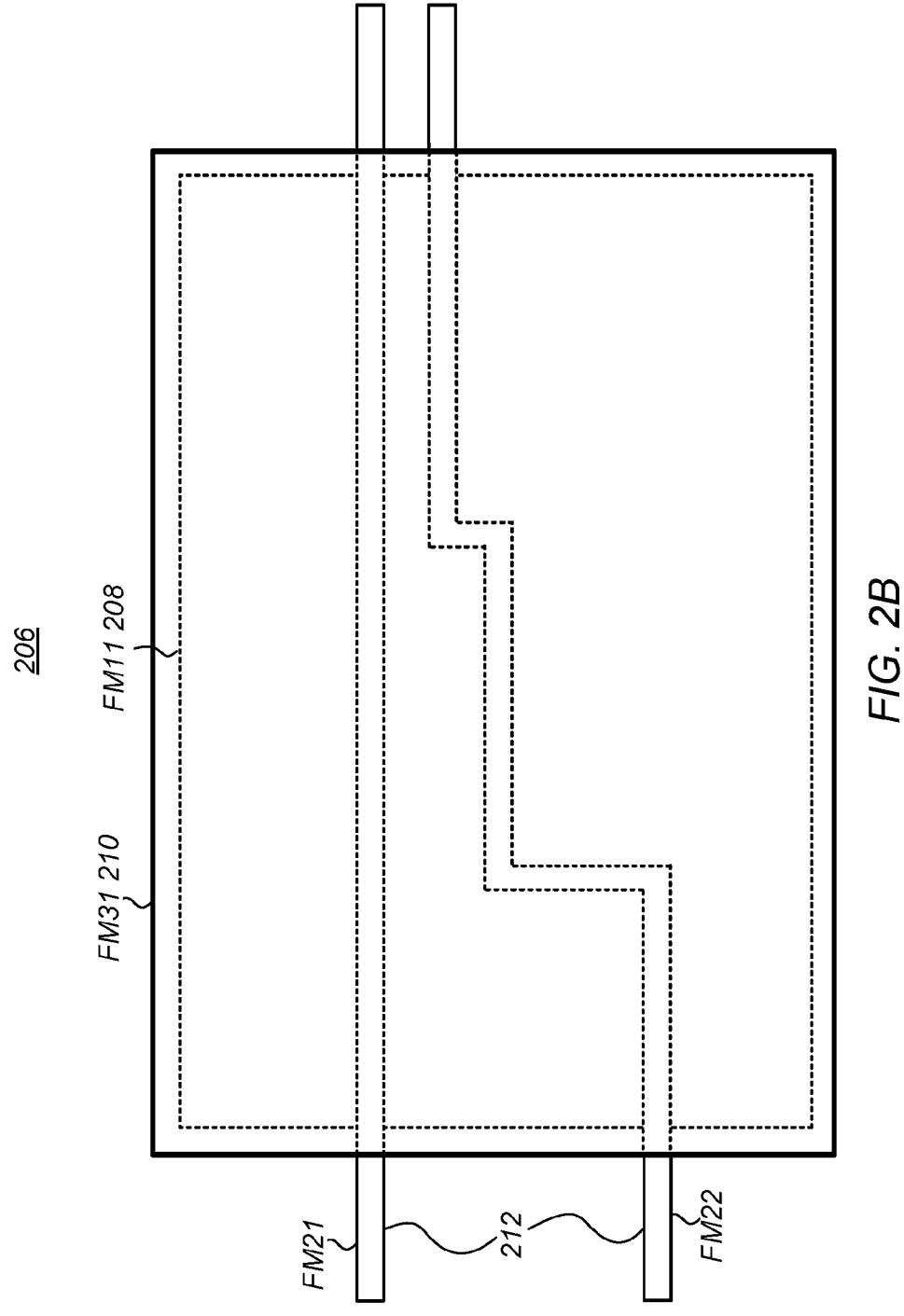
FIG. 2B illustrates an example text layout structure with three layers.

FIG. 2B illustrates an example test layout structure 206 with three layers, arranged in accordance with at least some embodiments described herein.

The example test layout structure 206 in FIG. 2B includes bottom layer 208—Metal 1 (text label FM11); top layer 210—Metal 3 (text label FM31); and middle layer or bus 212—Metal 2 (text labels FM21 and FM22).

Figure 2C:
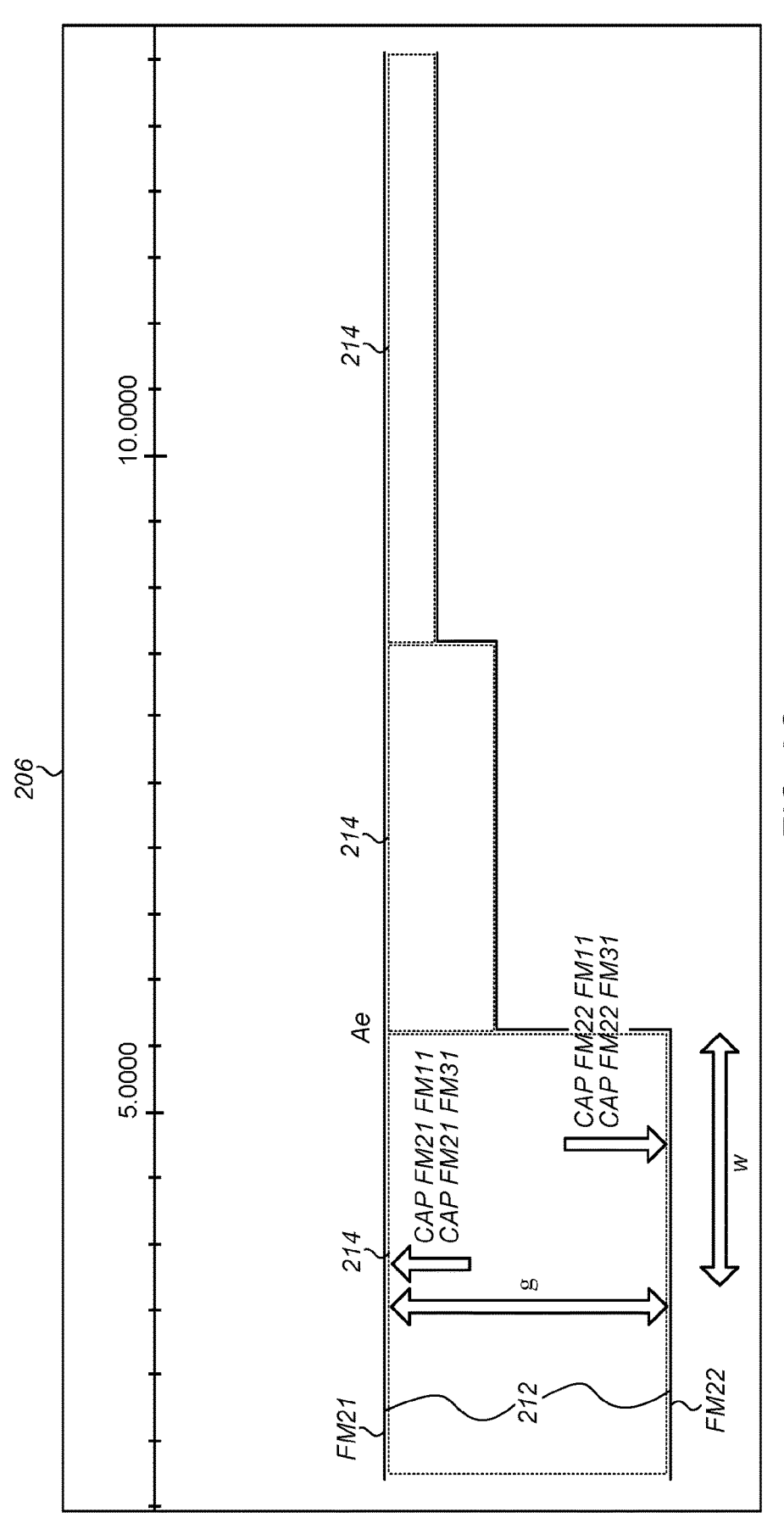
FIG. 2C illustrates horizontal constituents of the layout coupling capacitance and fringe capacitance for the test layout structure.

FIG. 2C illustrates horizontal constituents of the test layout structure 206 coupling capacitance and fringe capacitance for the test layout structure of FIG. 2B, arranged in accordance with at least some embodiments described herein.

In FIG. 2C, horizontal (AE layers) constituents of the layout coupling capacitance (Cc) and fringe capacitance (Cf) are shown. Frame polygons 214 used to find the space g between the edges of the conductive layer are shown in dashed lines. For this technology the minimal width of Metal 2 bus (212) is d=0.2 μm, and the minimal space is wd=0.21 μm. For n=7 in this variant of extraction the minimal space between Metal 2 buses that will be taken into consideration is gmax <3.08μ.

In FIGS. 2B and 2C, the borderline for the layout section of parasitic capacities of Metal 2 layer (label FM21) are shown with same structure but different spaces between parallel polygons of the central layer.

Figure 2D:
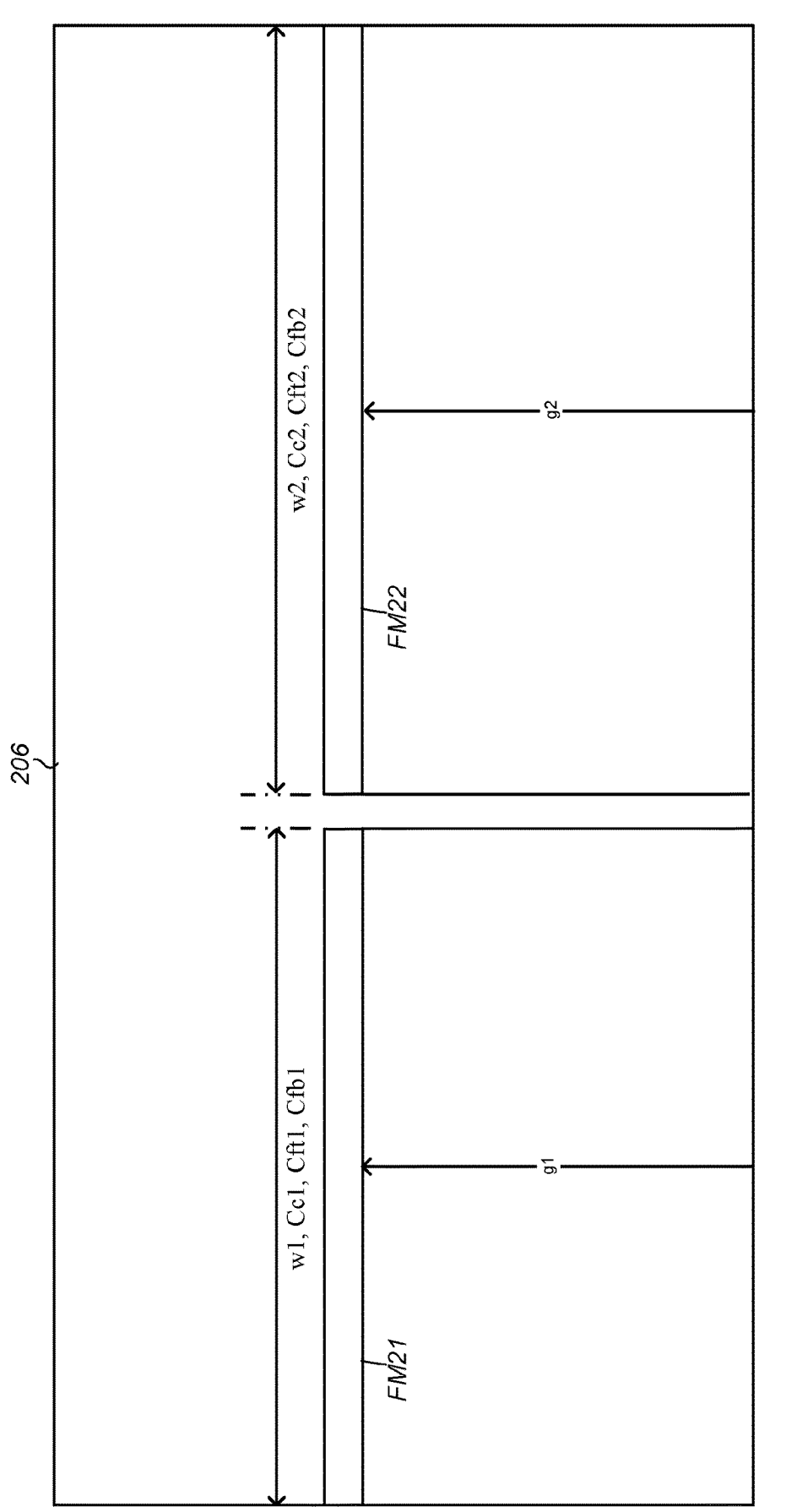
FIG. 2D illustrates the borderline for the layout section of parasitic capacitances of one of the layers.

FIG. 2D illustrates enlarged image of the boundary between the parasitic capacitances Cc, Cft, Cfb of the Metal 2 layer (FM21 and FM22) with the same structure of top and bottom metals, but different distances, w1 and w2, between the parallel polygons of the central layer.

Figure 2E:
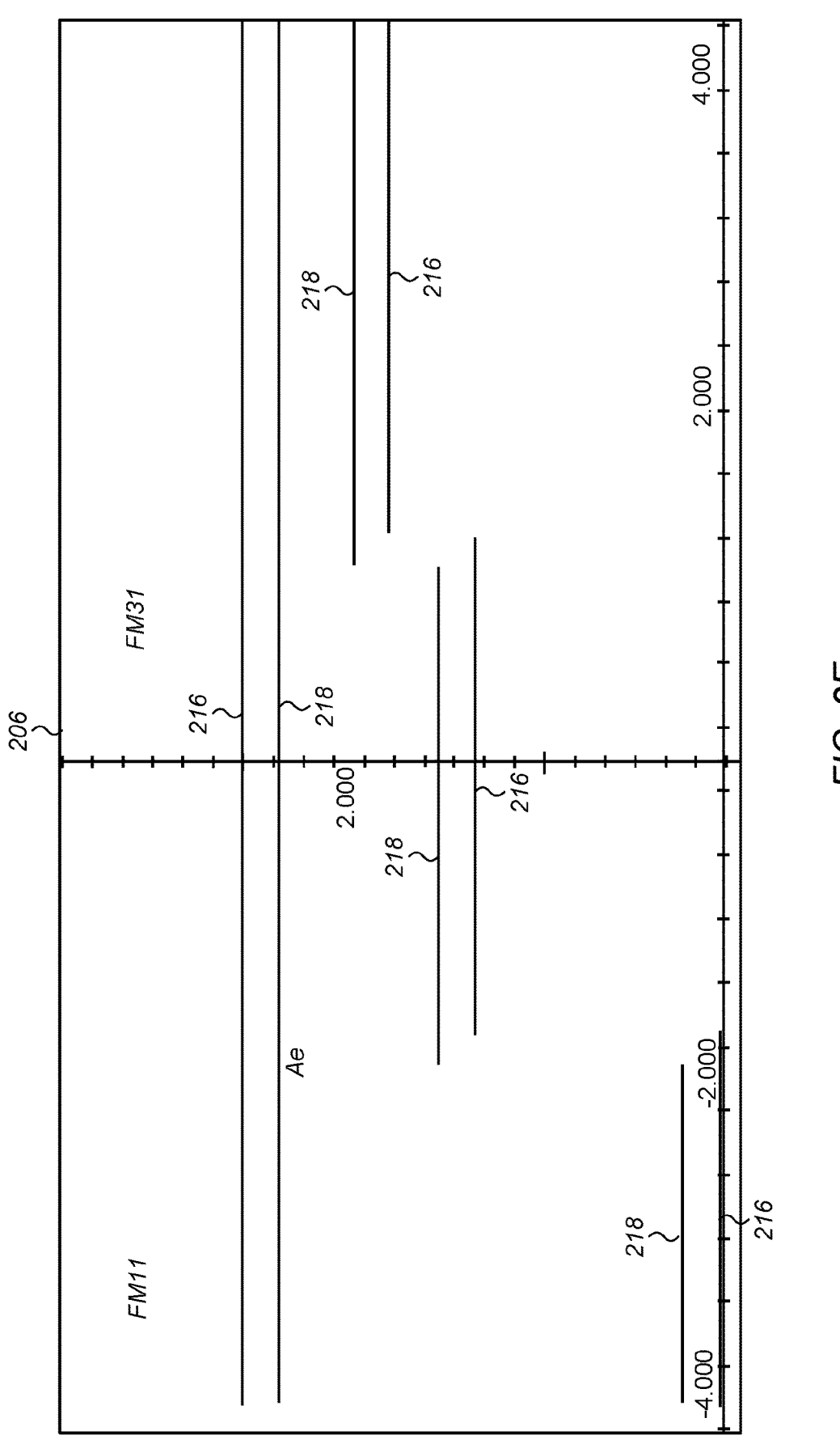
FIG. 2E illustrates horizontal layers forming the topology of parasitic fringe capacitance.

FIG. 2E illustrates a portion of the test layout structure 206 where horizontal layers Ae 216 form the topology of parasitic fringe capacitance Cf for the case when there are no parallel polygons of central layer at space >gmax. The FIG. also shows horizontal layers Ae 218 forming the topology of parasitic fringe capacitance Cf for the case when there are parallel polygons of central layer at space <gmax.

The extracted values of capacitances may be written to an output SPICE netlist to corresponding nodes or between corresponding nodes. An example of output netlist with extracted fringe capacitances (shown in FIG. 2C) in SPICE format. For every parasitic capacitance in addition to its calculated value the figure shows width w and space g to neighboring parallel polygon in Metal 2 layer. As the above-provided example shows, each edge has two capacitances related to the central layer, namely capacitance with Metal 1 and capacitance with Metal 3. The SPICE netlist may look like:

```
c_CAPFF531_1469    (FM22    FM11)    CAPFF531
  c=38.81C1 g=2.175 w=2.030
c_CAPFF531_1470    (FM22    FM11)    CAPFF531
  c=53.955a g=0.858 w=2.923
c_CAPFF531_1471    (FM22    FM11)    CAPFF531
  c=50.566a g=0.400 w=3.220
c_CAPFF531_1472    (FM21    FM11)    CAPFF531
  c=38.81C1 g=2.175 w=2.030
c_CAPFF531_1473    (FM21    FM11)    CAPFF531
  c=53.955a g=0.858 w=2.923
c_CAPFF531_1474    (FM21    FM11)    CAPFF531
  c=50.566a g=0.400 w=3.220
c_CAPFF532_1475    (FM22    FM31)    CAPFF532
  c=38.81C1 g=2.175 w=2.030
c_CAPFF532_1476    (FM22    FM31)    CAPFF532
  c=53.955a g=0.858 w=2.923
c_CAPFF532_1477    (FM22    FM31)    CAPFF532
  c=50.566a g=0.400 w=3.220
c_CAPFF532_1478    (FM21    FM31)    CAPFF532
  c=38.81C1 g=2.175 w=2.030
c_CAPFF532_1479    (FM21    FM31)    CAPFF532
  c=53.955a g=0.858 w=2.923
c_CAPFF532_1480    (FM21    FM31)    CAPFF532
  c=50.566a g=0.400 w=3.220
```

The above-described approach allows formalization of the procedure of extraction of parasitic capacities depending on the presence of specific conductive layers in the layout, improvement of applicability of the procedure and flexibility in the usage of various models to calculate capacities.

Figure 3A:
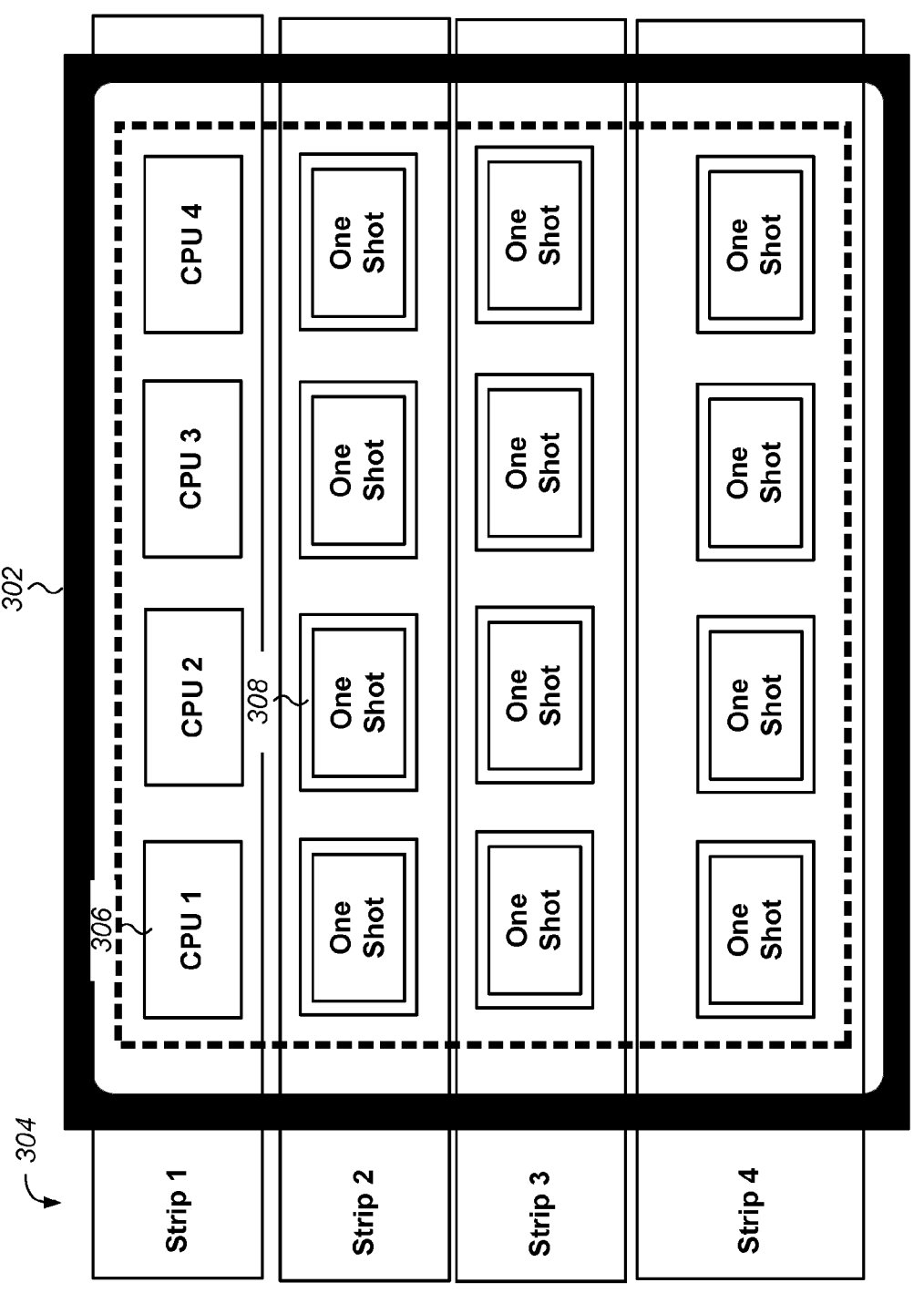
FIG. 3A illustrates an integrated circuit (IC) layout in strip mode with strips covering the entire IC.
Figure 3B:
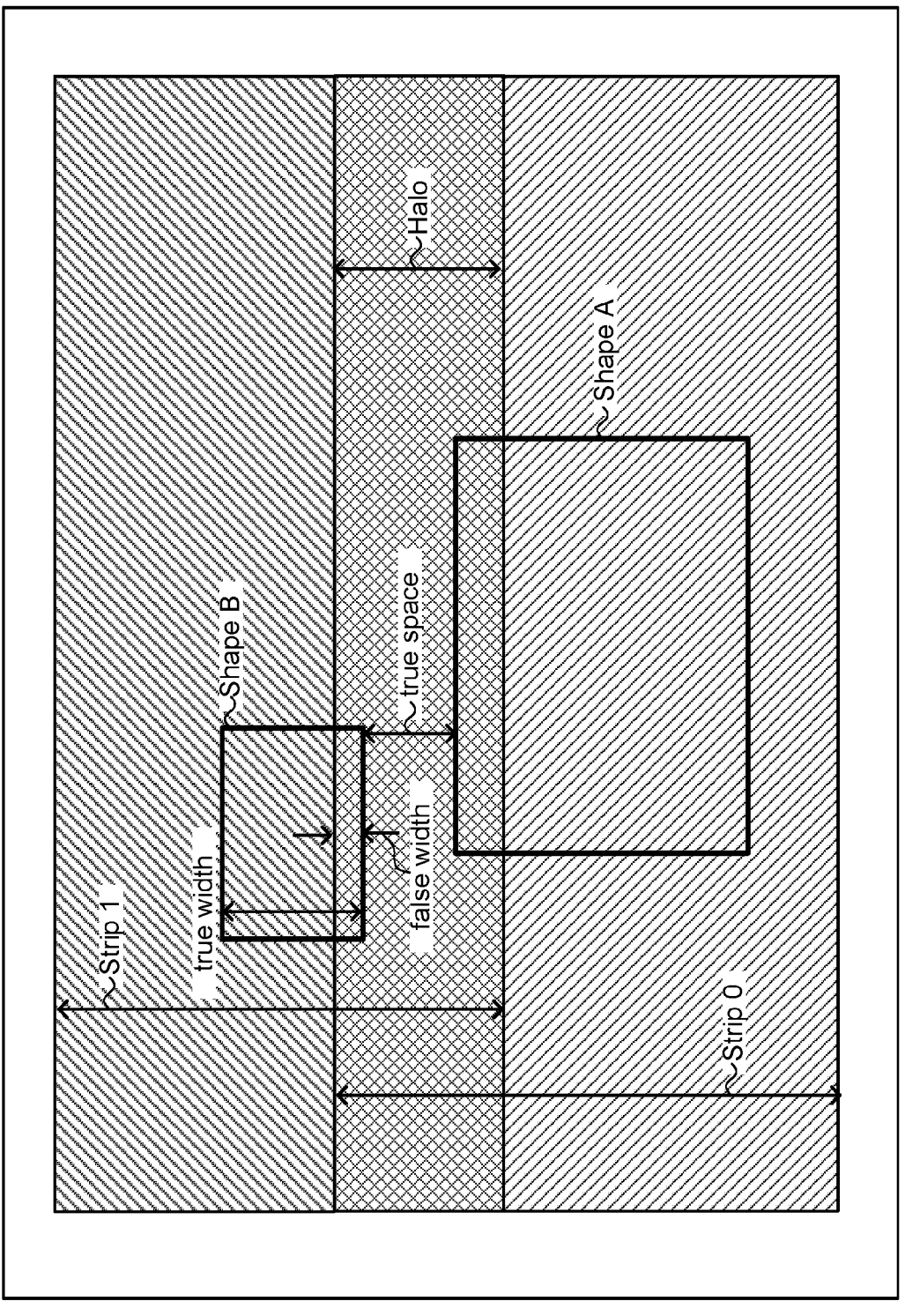
FIG. 3B includes an illustration of rule checks in an example two-strip configuration.
Figure 3C:
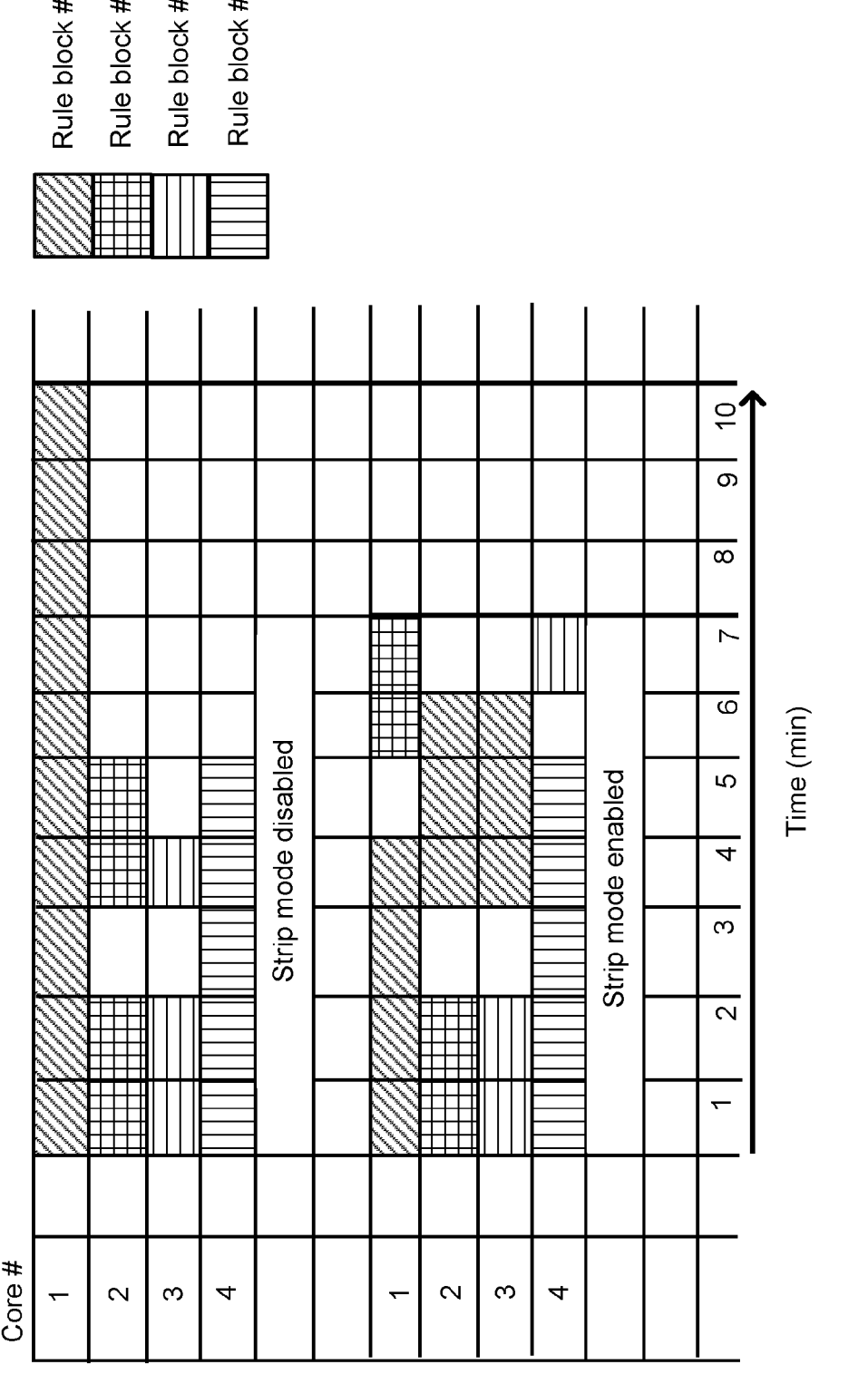
FIG. 3C illustrates use of strip mode to accelerate common results in an example case of a 4-core system.

FIG. 3A through 3C and associated descriptions are directed to automatic splitting of integrated circuit layout for parallel processing (also referred to herein as strip mode). As used herein a rule block refers to a subset of rules that includes only similar operations, e.g. spacing checks; a macroblock refers to a subtree in the description of a chip hierarchy that satisfies certain requirements for macroblocks; a cell array refers to a subtree in the description of a chip hierarchy that satisfies certain requirements for cell arrays; and halo refers to a value that defines the area of neighborhood, in which the level of interaction of a layout description element (a vector or a point) with its environment should be calculated.

One of the major approaches to improve performance is to use parallel processing, wherein the entire verification task is broken down to multiple smaller portions processed in parallel by available CPU cores. The portions may range in size from computer instructions to subroutines to programs. The smaller the portion, the more cores may be involved and the less is dependence on the data specifics. However, too many portions inevitably result in bigger overhead due to necessity to synchronize the tasks and merge more individual results. Yet, it is the way chosen in the conventional PV tools, which employ zone-based and fine-grain parallelism.

Some embodiments are directed to producing moderate number of parts giving more balanced computing and synchronization time. In such embodiments, an algorithm of automatic breaking of rule deck into blocks may be used followed by splitting of IC layout into strips that can be processed separately.

FIG. 3A illustrates an integrated circuit (IC) 302 layout in strip mode with strips 304 covering the entire IC, arranged in accordance with at least some embodiments described herein. In particular, strip 1 covers central processing units (CPUs 306) 1 through 4 formed on the IC 302, while strips 2 through 4 cover a number of one shot circuits 308.

All rules in a Design Rule Checking (DRC) rule deck may be categorized into three types: (1) The rules that can be checked for the entire chip only, e.g. density, fill, latch-up, as well as the rules that require connectivity information since such information is only available for the entire chip. (2) The rules that are checked in the area, which size cannot be specified with numeric values, e.g. selection rules like interact. (3) The rules that need information on the check location per se and its surrounding area, which size is defined by a special rule constraint called halo. Typical examples of this type are rules like space, width, and enclose.

If a rule block contains at least one rule of type (1), such rule block can only be processed in flat mode applied to the entire chip. The presence of a type (2) rule requires the rule block to be processed in flat mode, yet not for the entire chip, but for the hierarchy cell detected during chip hierarchy analysis on the set of input layers of that rule block. A rule block without rules of types (1) and (2) may be applied not to the entire chip in one process but in several processes, each assigned to a separate part (strip) of the chip.

Strip mode implies verification of the entire chip in flat mode not within one process but within several, each working its own strip, and the strips covering the entire chip from its left side to the right one as shown in FIG. 3A. The strip height may be initially calculated by division of the chip height by the number of processes to work the given rule block and adding double halo size to that.

FIG. 3B includes an illustration of rule checks in an example two-strip configuration, arranged in accordance with at least some embodiments described herein.

FIG. 3B shows that, during rule block processing in the strip Strip0, the shape 'Shape A' is selected entirely, and the shape 'Shape B' is selected partly (its lower part). The space rule check gives true result. Yet the width rule check gives false result, which has to be excluded because the rule's true result may be obtained on processing Strip1, when Shape B is selected in its entirety.

FIG. 3C is a graph of run time for each core of a multi-core system, and illustrates use of strip mode to accelerate common results in an example case of a 4-core system, arranged in accordance with at least some embodiments described herein. Referring to FIG. 3C the top portion of the required CPU/Process run time where strip mode is disabled and each core, 1 through 4, executes a separate rule. The bottom portion of FIG. 3C illustrates the case wherein strip mode is enabled and wherein each CPU core after being idled for a single block of time, is automatically switched to execution of another rule.

Strip mode by itself may not accelerate obtaining results but may allow breaking one long process into N processes, each N times faster on the average than the initial process. FIG. 3C shows how strip mode is used to speed up getting common result in the case of a 4-core system. The rule block #1 in FIG. 3C may be critical in calculating the total processing time for the rule deck. If that process is run in strip mode, the total processing time may be significantly reduced.

FIG. 4A through 4E and associated descriptions are directed to use of metadata matrix to minimize volume of information and resources needed for generating fillers for integrated circuit masks.

Associated embodiments include a method applicable for generating dummy filling elements in masks that are used for manufacturing ICs. Dummy fillers are necessary for achieving uniformity of certain layers deposited during IC manufacturing, such as polysilicon, metal, and other types of thin films. Such embodiments also allow minimization of the total number of dummy fillers inserted into layout of certain layer of an integrated circuit. Needed computing resources and volume of data that is used for mask manufacturing may also be reduced.

Figure 4A:
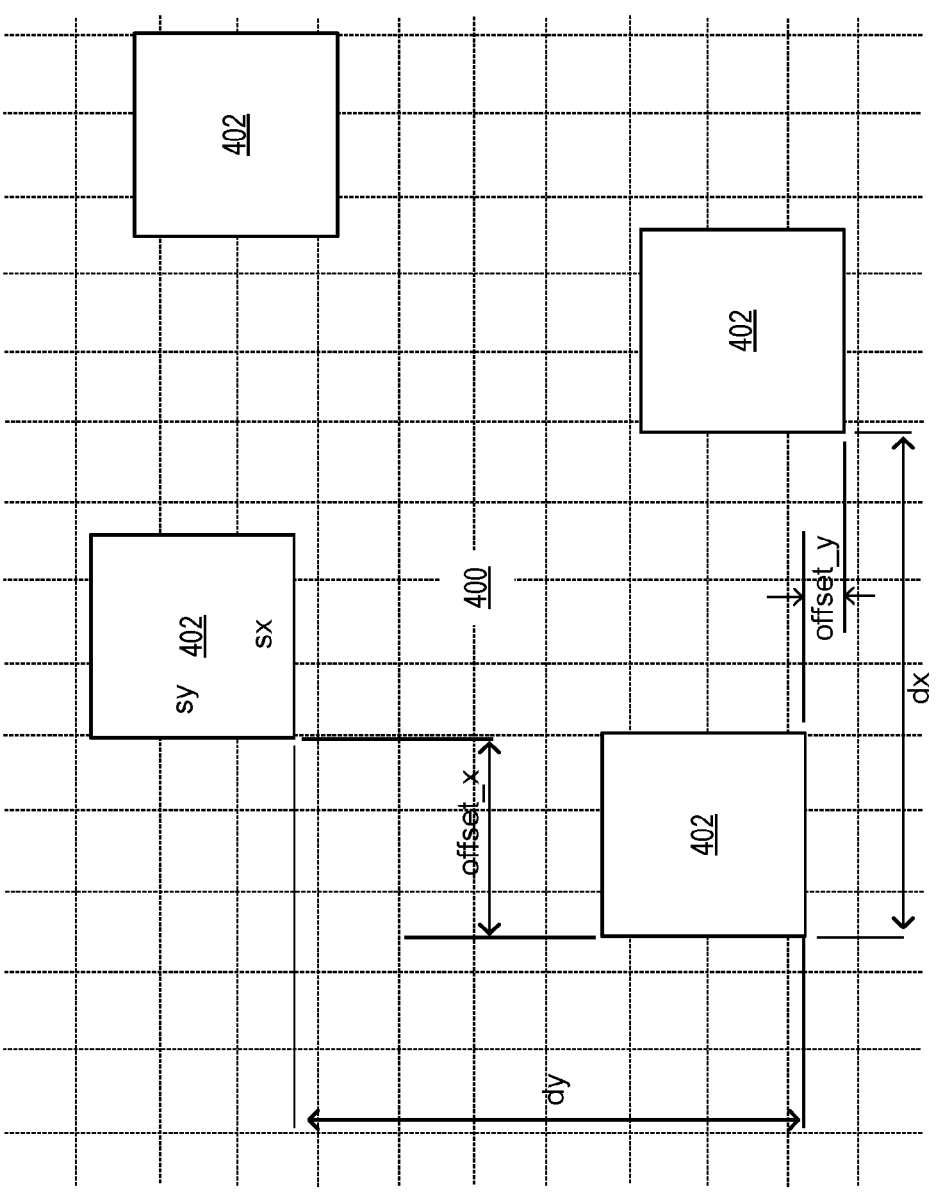
FIG. 4A illustrates an explanation of the designations used in FIGS. 4A through 4E to describe use of metadata matrix to minimize volume of information and resources needed for generating fillers for integrated circuit masks.

FIG. 4A illustrates the designations used in FIG. 4B through 4E and corresponding descriptions. In particular, polygonal fill elements 402 represent dummy fill elements on a surface of a substrate 400, and while fill parameters sx and sy represent the size of the fill elements in the x and y direction, dx and dy represent the change in x and y respectively, and offset_x and offset_y represent the offset of fill elements.

According to some embodiments, every fill may be presented as a '1' in a bit matrix, whose dimension corresponds to the entire filling area. The latter may represent either the entire chip or a certain part of it, which is being filled with shapes of a layer specifically created for filling. The conversion of coordinates of the filling area into indices of the bit matrix and vice versa may be performed according to the following formulas:

The conversion of the bit matrix indices (x y) into fill coordinates (px py):

$$px=xbaseC+(x-xbaseI)*dx+(y-ybaseI)*offset\_x;$$

$$py=ybaseC+(y-ybaseI)*dy+(x-xbaseI)*offsety;$$

The conversion of the fill coordinates (px py) into bit matrix indices (x y):

$$C1=px-xbaseC+xbaseI*dx+ybaseI*offset\_x;$$

$$c2=py-ybaseC+ybaseI*dy+xbaseI*offset\_y;$$

$$DX=C1*dy-c2*offset\_x;$$

$$DY=c2*dx-C1*offset\_y;$$

$$x=(int)(DX/determinant);$$

$$y=(int)(DY/determinant);$$

where determinant=dx*dy−offset_y*offset_x; xbaseC and ybaseC are the topology point of origin for the fills; and xbaseI and ybaseI are the bit matrix indices corresponding to the point of origin The designations are also shown in FIG. 4A.

The fills may be generated in the process of scanning the entire area by small windows not less than max(10*dx, 10*dy) in size. At each scanning window position:

If the area is to be filled with continuous fills, then the bit matrix in the part corresponding to the scanning window position is filled with '1's.

If the area is not to be filled, then the bit matrix in the part corresponding to the scanning window position is filled with '0's.

Otherwise, i.e., when fills are not to be continuous, a temporary layer may be created with fills covering the scanning window position, and selection is performed with the help of this TMP layer and the verification software of choice (e.g. INSIDE, OUTSIDE, NOT INTERACT of Calibre SVRF language).

Thus, the filling process generates a bit matrix (chip·width/dx)*(chip·length/dy) in size and an auxiliary layer TMP 10*10*LEN(box) in size, where LEN(box) takes at least 20 bytes. With the traditional approach, in the worst case, a 10×10 mm2 chip with step dx/dy=1 mkm requires 200,000,000 bytes for the entire layer, whereas with an approach according to embodiments only 25,000,000 bytes are needed for the bit matrix and 20,000 bytes for TMP layer.

Figure 4B:
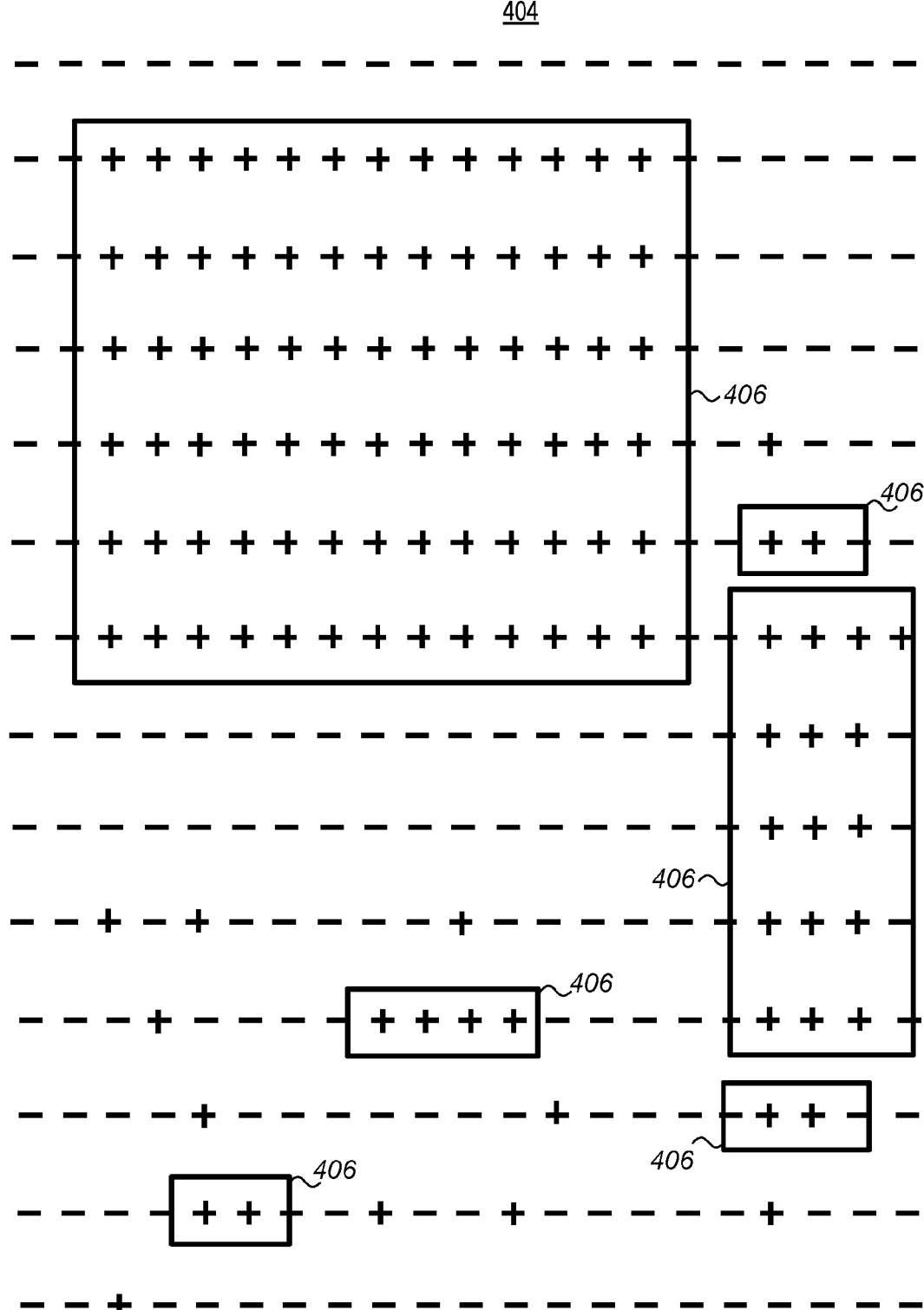
FIG. 4B illustrates a fragment of the matrix.

FIG. 4B illustrates a fragment of the bit matrix 404, arranged in accordance with at least some embodiments described herein. Referring to FIG. 4B 406 represent polygonal fill elements of the same conductive layer, the '+' symbols represent locations in the matrix which fill elements will be added, and symbols represent locations without fill elements.

Figure 4C:
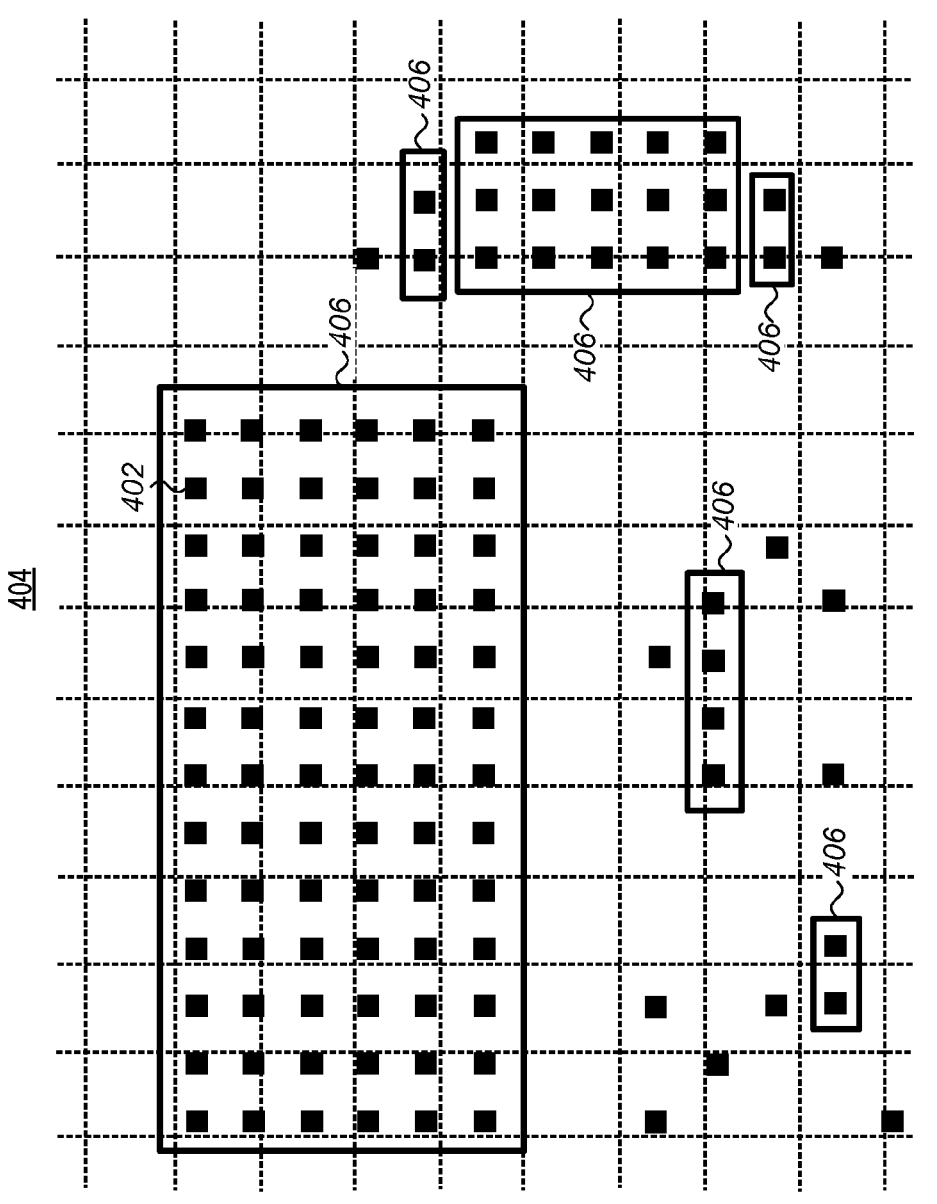
FIG. 4C illustrates locations of fills without offsets for the fragment in FIG. 4B.

FIG. 4C illustrates locations of fills or fill elements 402 without offsets for the fragment of the bit matrix 404 in FIG. 4B, arranged in accordance with at least some embodiments described herein.

Figure 4D:
FIG. 4D illustrates another fragment of the matrix.

FIG. 4D illustrates another fragment of the bit matrix 404, arranged in accordance with at least some embodiments described herein. Referring to FIG. 4D, again 406 represent polygonal fill elements of the same conductive layer, the '+' symbols represent locations in the matrix which fill elements will be added, and symbols represent locations without fill elements.

Figure 4E:
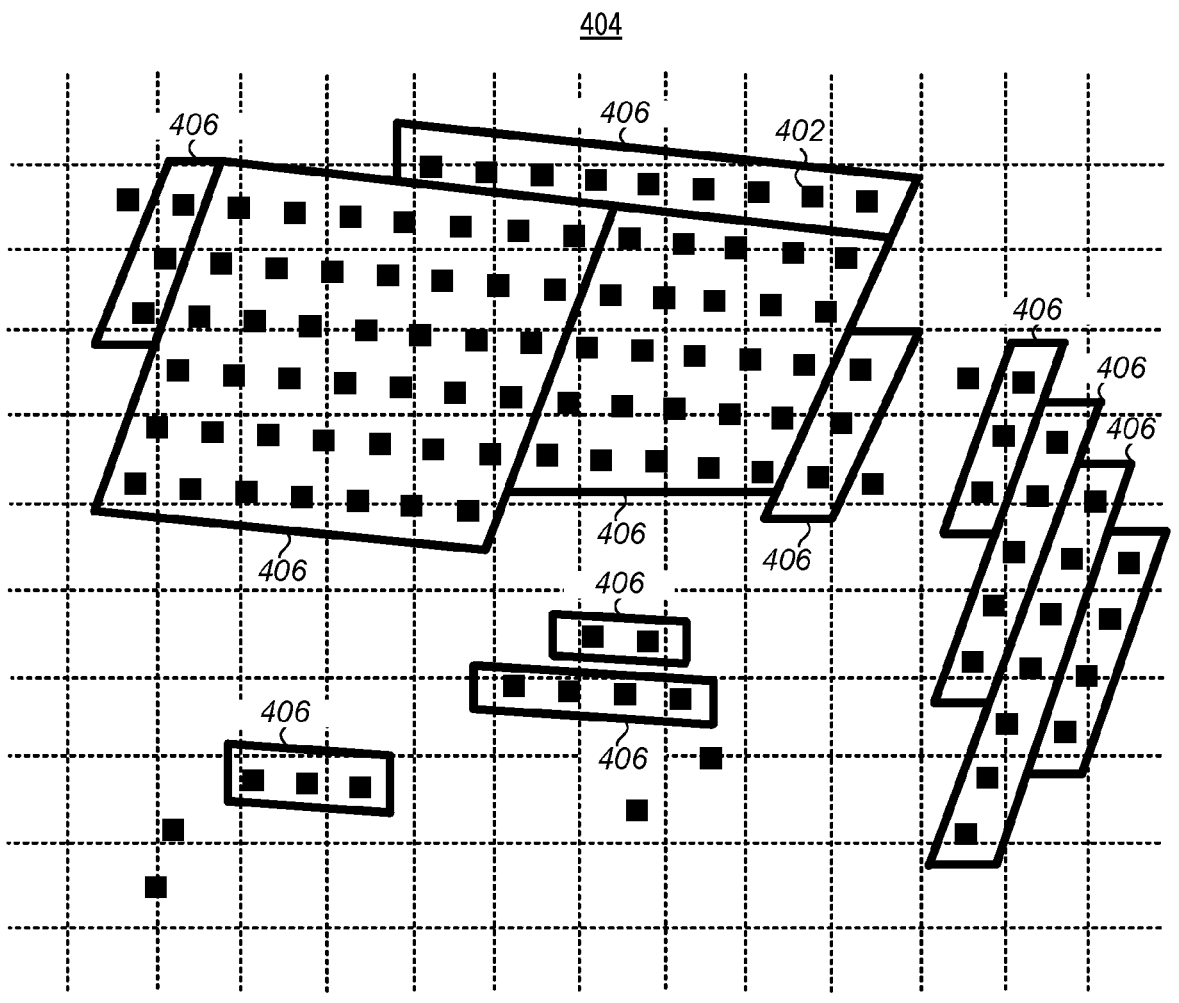
FIG. 4E illustrates locations of fills without offsets for the fragment in FIG. 4D.

FIG. 4E illustrates locations of fills or fill elements 402 without offsets for the fragment of the bit matrix 404 shown in FIG. 4D, arranged in accordance with at least some embodiments described herein. As in FIGS. 4B and 4C 406 represent polygonal fill elements of the same conductive layer.

Using a bit matrix may notably reduce not only the memory footprint for the filling operation but also the size of the output file. A fragment of a bit matrix is shown in FIG. 4B and corresponding location of fills without offsets is shown in FIG. 4C. Another fragment is shown in FIG. 4D and corresponding location of fills with offsets is shown in FIG. 4E.

The minimization of size of the output file can be achieved through detection of rectangular areas in the bit matrix, which cover all bits with the minimal number of '1' values, because the rectangular area itself may be represented in the output file either directly as iteration with a set of nx, ne, dx, dy, offset_x, offset_y parameters in the case of output in OASIS format (with zero-value offset_x and offset_y in GDSII format), or as a decomposition of a bigger area into a set of smaller ones thus creating a tree of fills.

The fragments of rectangular shapes shown in FIGS. 4C and 4E, in combination with fill parameters sx, sy, dx, dy, offset_x, and offset_y, may serve as a compact representation of a fill layer, when the layer is used in other checks or in generation of other fills with different parameters.

Figure 5A:
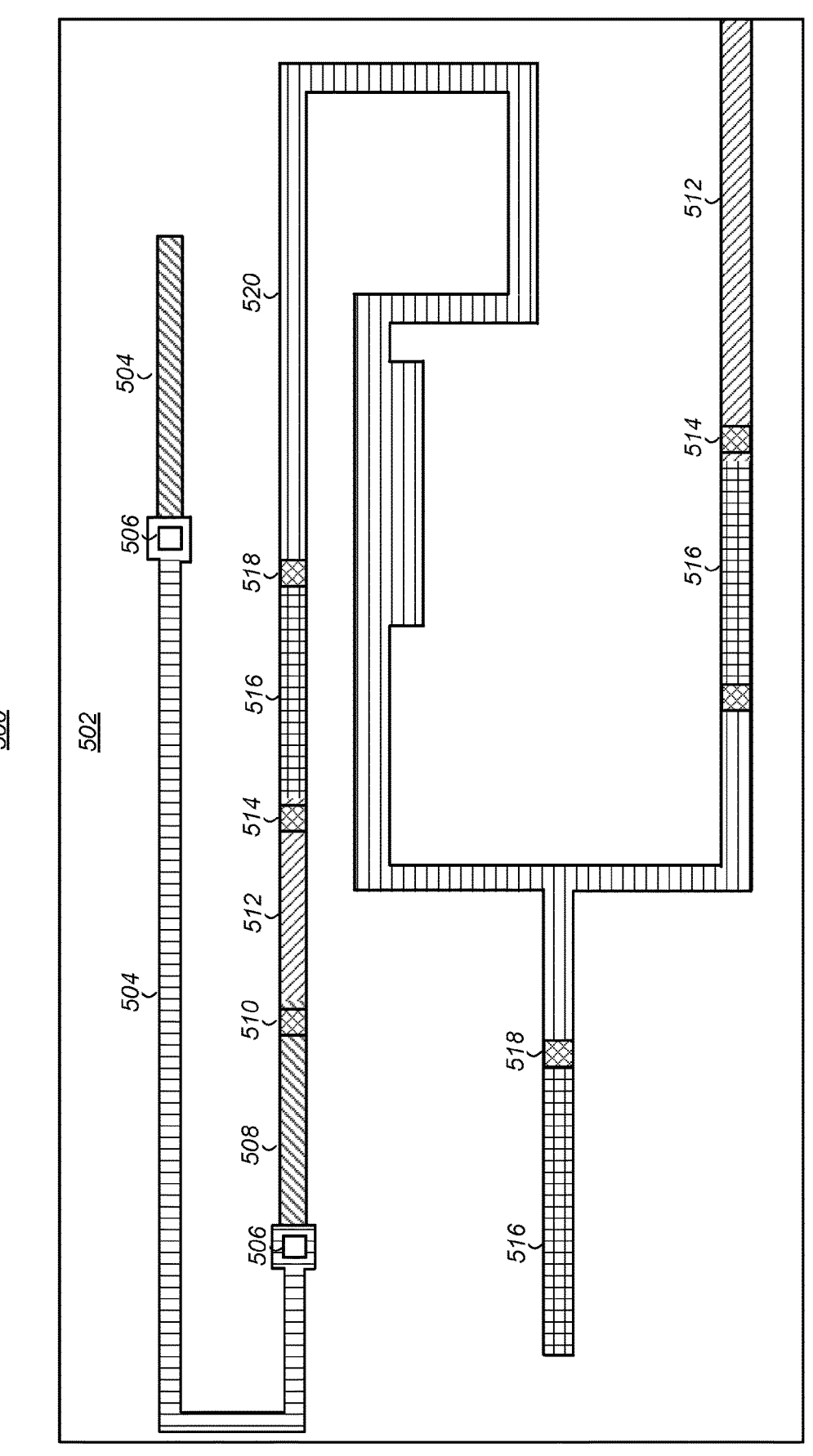
FIG. 5A illustrates an example of the initial (input) test structure for extraction of parasitic resistors.
Figure 5B:
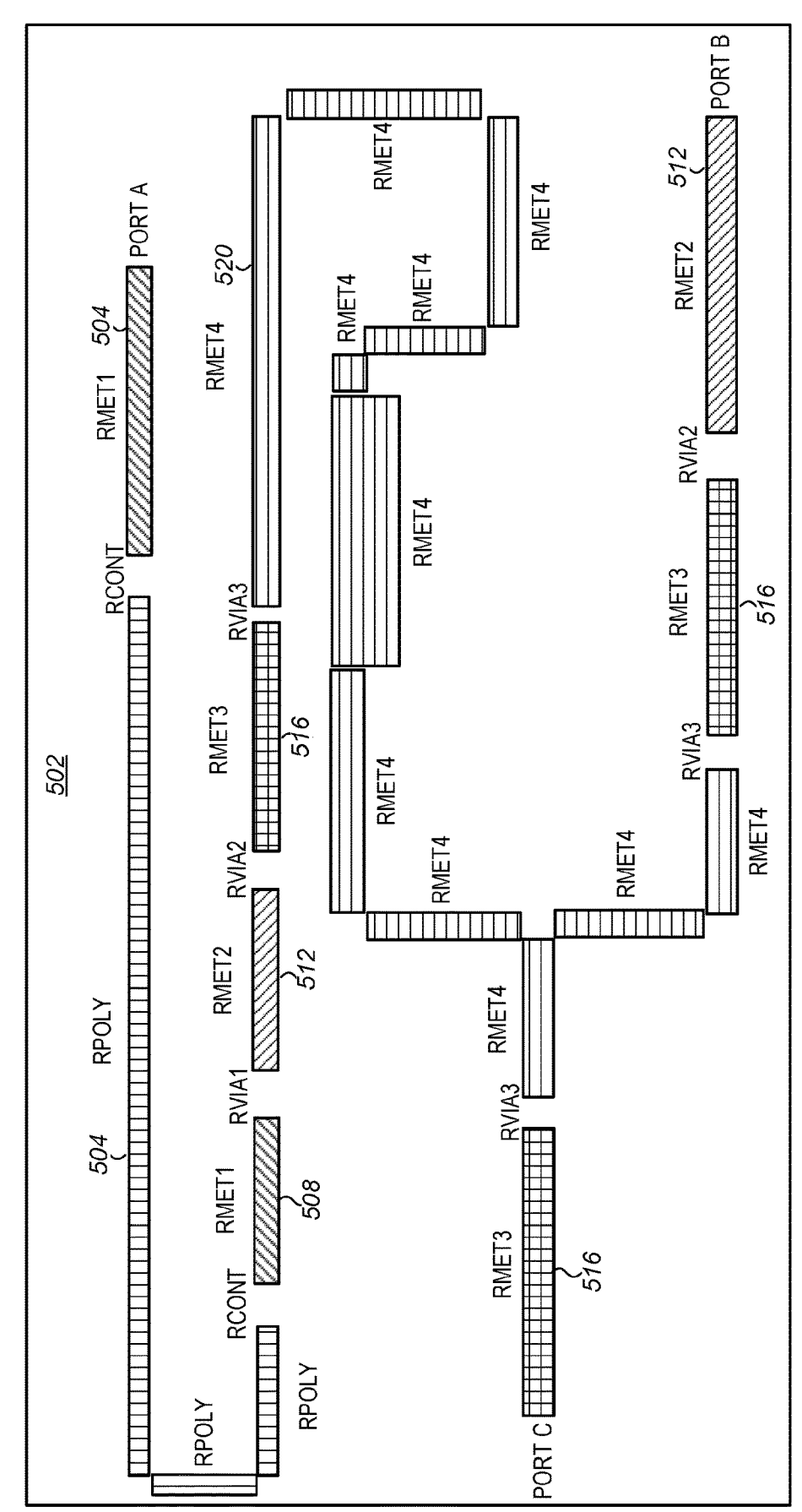
FIG. 5B illustrates a segment of the conductive layers and of contacts/via after extraction of parasitic resistors.
Figure 5C:
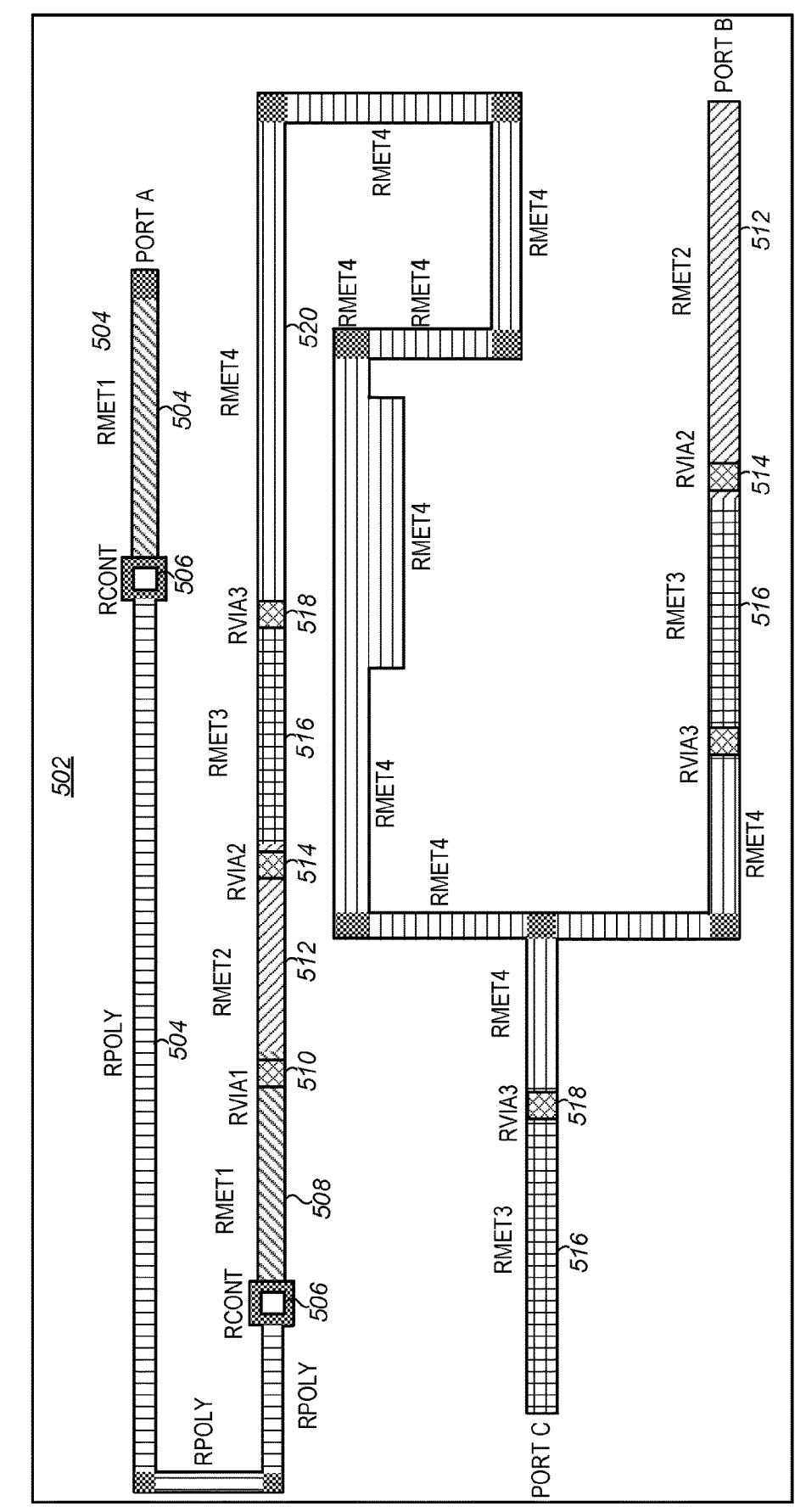
FIG. 5C illustrates the combined test structure and the extracted parasitic resistors, some of which are arranged in accordance with at least some embodiments described herein.

FIG. 5A through 5C and associated descriptions are directed to extraction of parasitic resistance and capacitance. Unlike the case of extraction of parasitic capacitance, where the number of nodes does not change, the number may change considerably during extraction of parasitic resistance. In the electronic design automation industry, there are extraction methods with distributed extraction parameters, but they cause undue rise of the number of design nodes.

Thus, associated embodiments are directed to obtaining, during extraction of parasitic resistances, a netlist for an arbitrary layout of conductive resistors without loss of the initial connectivity. For further simulation, extraction of parasitic resistance may be performed along with extraction of the layout active elements (transistors, capacitors, etc.).

Extraction of parasitic resistance is deemed here as extraction of resistance of conductive layers for only metal and polysilicon layers and resistance of contacts and vias. Resistors of polysilicon may be extracted only for the areas beyond active layers, i.e., the resistance of MOS-transistors gates is not considered in this procedure and should be handled with different methods.

Embodiments described herein are based on the replacement of rectangular layer segments of conductors with layers of parasitic resistors with breaking them into vertical, horizontal or any-angled constituents. The resistive layer is not generated at the junction point of horizontal and vertical constituent to provide connectivity by conductive layers. The length of conductive layer segment is only limited by the space between pins and vias, bus bend or the location of bus width change, labels to conductive layers.

An example process according to embodiments may be as follows:

1) Since, during layout processing, the labels for conductive layers (save for a few specific cases) get into newly built resistive layers and get lost, special layers TLi are created that prevent forming of resistive layers in the labels area. The size of these layers may not exceed the value of:

$$m < 2 * dmini,$$

where dmini—the value of the minimal gap between the buses of the i-th conductive layer.

2) To extract resistance of pins and vias new CVi layers are created, which prevent generation of resistive layers in the areas of pins and vias. Compared to initial layers of pins and vias, the size of CVi layers is increased by the value of:

$$mv < wmini,$$

where wmini—minimal width of the i-th conductive layer, and the last digit in the value of my is less than design grid to avoid accidental touch to the adjoining bus and loss of connectivity.

3) Preliminary preparation of conductive layers includes removal from the corresponding conductive layers of those layout parts, which form active elements and have models that include—among others—resistors (e.g. transistors, resistors, capacitors, etc.) as well as newly created layers m and my.

4) Using edge operation in the software tool of choice, convert edges into new rectangular layers Ae with fixed minimal width of wa depending on the grid, their length reduced by minimal value. The minimal wa width is a given, i.e. known, value that is chosen in a way to minimize distortions in geometric parameters of resistors. For a polygon of arbitrary shape, one can only calculate directly its area and full perimeter. By building Ae layers of the given wa width, the part of the target perimeter may be calculated.

5) For parallel edges (horizontal, vertical, or any-angled) of conductive layers rectangular layer frames FRi are built to calculate the line width. To avoid incorrect calculation of the width at minimal pitches of conductive layers, the frames are built with breakdown into ranges as follows:

$$FR1 = wd + 2*d \ wd - am;$$

$$FRn = d \ min + 2*wd - am + (n-1)*(d \ min + wd).$$

where: dmin—the minimal bus width; wd—the minimal space between buses of the same layer; and am<<dmin—parameter.

6) With logical AND operation between Ae layers, FR and the layers of conductors build new layers that define the structure of segments of parasitic resistors.

7) For every found geometry of parasitic resistors calculate their length and—with the frames—their width.

8) With connections between layers through pins and via preliminarily removed from the initial rule deck, add them as parasitic resistors for connection between layers.

FIG. 5A illustrates an example of the initial (input) test structure for extraction of parasitic resistors, arranged in accordance with at least some embodiments described herein.

In FIG. 5A, an example is shown of the layout for extraction of parasitic resistors test structure 500. Briefly, the resistors test structure 500 includes of number of patterned conductive layers and structures formed on a substrate 502 including a polysilicon or poly layer 504, contacts 506, a first metal layer (Metal1 508), a number of first vias (Via1 510), a second metal layer (Metal2 512), a number of second vias (Via1 514), a third metal layer (Metal3 516), a number of third vias (Via3 518), and a fourth metal layer (Metal4 520). The conductive layers and structures are formed in the following sequence: Poly-Cont→Metal1→Vi2A→Metal2→Vi2B→Metal3→Vi2C→Metal4.

FIG. 5B illustrates a segment of the conductive layers and of contacts/via after extraction of parasitic resistors, arranged in accordance with at least some embodiments described herein.

FIG. 5C illustrates the combined test structure and the extracted parasitic resistors, arranged in accordance with at least some embodiments described herein.

An example of the extracted netlist containing parasitic resistor devices may be as follows:

subckt Rtest_1 A B C
  r_resistor 1 (lvs_6 lvs_8) resistor 1=0.687 u w=0.130 u
    r=36.992 x=−11.443 y=10.175
  r_resistor 2 (lvs_6 lvs_5) resistor 1=1.004 u w=0.130 u
    r=54.062 x=−11.307 y=10.039
  r_resistor 3 (lvs_8 lvs_7) resistor 1=6.255 u w=0.130 u
    r=336.808 x=−11.307 y=10.868
  r_resistor 4 (lvs_13 lvs_12) resistor 1=1.164 u w=0.160 u
    r=0.873 x=−9.847 y=10.023
  r_resistor 5 (lvs_14 A) resistor 1=1.528 u w=0.160 u
    r=1.146 x=−4.596 y=10.858
  r_resistor 6 (lvs_15 B) resistor 1=2.198 u w=0.200 u
    r=0.934 x=−3.815 y=7.024
  r_resistor 7 (lvs_16 lvs_17) resistor 1=0.924 u w=0.200 u
    r=0.393 x=−8.127 y=9.997
  r_resistor 8 (lvs_30 lvs_31) resistor 1=1.316 u w=0.200 u
    r=0.559 x=−5.727 y=7.024
  r_resistor 9 (C lvs_33) resistor 1=1.465 u w=0.200 u
    r=0.623 x=−10.418 y=8.222
  r_resistor 10 (lvs_34 lvs_35) resistor 1=1.204 u w=0.200
    u r=0.512 x=−6.607 y=9.999
  r_resistor 11 (lvs_18 lvs_19) resistor 1=0.920 u w=0.200
    u r=0.391 x=−7.243 y=7.025
  r_resistor 12 (lvs_21 lvs_20) resistor 1=0.902 u w=0.200
    u r=0.383 x=−8.357 y=8.222
  r_resistor 13 (lvs_22 lvs_23) resistor 1=1.492 u w=0.200
    u r=0.634 x=−3.031 y=8.445
  r_resistor 14 (lvs_24 lvs_25) resistor 1=1.932 u w=0.460
    u 1=0.357 x=−5.474 y=9.243
  r_resistor 15 (lvs_25 lvs_26) resistor 1=0.287 u w=0.200
    u r=0.122 x=−3.530 y=9.485
  r_resistor 16 (lvs_27 lvs_24) resistor 1=1.757 u w=0.200
    u r=0.747 x=−7.243 y=9.487
  r_resistor 17 (lvs_29 lvs_28) resistor 1=3.268 u w=0.200
    u r=1.389 x=−4.807 y=9.995
  r_resistor 18 (lvs_18 lvs_20) resistor 1=0.985 u w=0.200
    u r=0.419 x=−7.449 y=7.231
  r_resistor 19 (lvs_20 lvs_27) resistor 1=1.053 u w=0.200
    u r=0.448 x=−7.449 y=8.428
  r_resistor 20 (lvs_22 lvs_26) resistor 1=0.828 u w=0.200
    u r=0.352 x=−3.237 y=8.651
  r_resistor 21 (lvs_23 lvs_28) resistor 1=1.338 u w=0.200
    u r=0.569 x=−1.533 y=8.651
  r_resistor 22 (lvs_13 lvs_5) resistor 1=0.200 u w=0.200 u
    r=12.000 x=−10.170 y=10.023
  r_resistor 23 (lvs_14 lvs_7) resistor 1=0.200 u w=0.200 u
    r=12.000 x=−4.919 y=10.857
  r_resistor 24 (lvs_16 lvs_12) resistor 1=0.300 u w=0.300
    u r=9.000 x=−8.500 y=10.001
  r_resistor 25 (lvs_31 lvs_15) resistor 1=0.400 u w=0.400
    u r=9.000 x=−4.208 y=7.029
  r_resistor 26 (lvs_34 lvs_17) resistor 1=0.400 u w=0.400
    u r=9.000 x=−7.000 y=10.002
  r_resistor 27 (lvs_19 lvs_30) resistor 1=0.500 u w=0.500
    u 1=9.000 x=−6.120 y=7.030
  r_resistor 28 (lvs_21 lvs_33) resistor 1=0.500 u w=0.500
    u r=9.000 x=−8.750 y=8.228
  r_resistor 29 (lvs_29 lvs_35) resistor 1=0.500 u w=0.500
    u r=9.000 x=−5.200 y=10.004 ends Rtest_1
The length and width of pins and vias are not used in calculation of resistance, but they are introduced to define the type:
  Cont—1=0.200μ, w=0.200μ,
  Via1—1=0.300μ, w=0.300μ,
  Via2—1=0.400μ w=0.400μ, and
  Via3—1=0.500μ, w=0.500μ.

FIG. 6 is a flow chart of a method for physical verification workflow for semiconductor circuit design. Referring to FIG. 6, the method begins with begins with splitting an integrated circuit (IC) layout into a number of windows for parallel processing using a plurality of central processing cores (602). Next, for each window, parasitic capacitance structures are extracted from the IC layout (604); fill elements for masks to fabricate an IC having the IC layout are generated using a metadata matrix to minimize volume of information and resources needed (606), and parasitic resistance structures are extracted from the IC layout (608). Optionally, in an embodiment not shown the method can further include prior to extracting parasitic capacitance structures from the IC layout (604) splitting the IC layout into a number of groups of rules for parallel processing using the plurality of central processing cores. This can be done in addition to or instead of splitting the IC layout into a number of windows.

FIG. 7 is a flow chart of a method for splitting an IC into a number of windows for parallel processing based on an automatic splitting of rules. Referring to FIG. 7, the method begins with begins with reordering the rules for processing in single-CPU mode (702), and finding rule file parts that need connectivity with identification of connect clusters (704). Next, based on the connect clusters, form the rule blocks that need connectivity and exclude them from further processing (706). Then find rule blocks that may be run in flat mode only (e.g. those with $density) and exclude these from further processing (708). Finally, the remaining rules are broken into a given number of blocks requiring roughly the same processing time—taking into account the number of vertices in the input layers, their type (e.g. orthogonal, 45°, or any angle), the number of layers and complexity (710).

FIG. 8 is a flow chart of a method for splitting an IC into a number of strips for parallel processing. Referring to FIG. 8, the method begins with begins with checking if the strip processing is applicable for the input rule blocks (802). This is followed by breaking or dividing the entire chip area into strips overlapping by the value of design constraint (804). Next, a dedicated verification process is initiated for each of the strips (806), and violations found on the upper and lower sides of strips are filtered out (808). On completion, the filtered out violations are gathered together and marked as false solutions (810).

FIG. 9 is a flow chart of a method for extracting parasitic resistance structures from an IC layout. Referring to FIG. 9, the method begins with begins with removing the connectivity between the layers from the original rule deck through the contacts and via (902). Next, new CVi layers are created, which exclude the formation of resistive layers in the regions of contacts and vias (904). New conductive layers are prepared (906), and an edge operation applied to transform new rectangular layers, Ae, with a fixed minimum width wa (908). For parallel edges (horizontal, vertical or at other angles of conductive layers), rectangular FRi frame layers are built to determine the distance of the line width (910). A Boolean AND operation between the layers Ae, FR and the conductive layers is applied, and new layers obtained that define the geometry of the parasitic resistance segments (912). For each found geometry of parasitic resistances their length and, using frames, width are calculated (914). Finally, the metal layers are connected using parasitic resistance instead of the vias and contacts that have been removed (916).

FIG. 10 is a flow chart of a method for extracting parasitic capacitances from an IC layout. Referring to FIG. 10, the method begins with begins with preparing the conductive layers by removing from the corresponding conductive layers those parts of layout, which form active devices and have models that include capacitance (1002). Next, an edge operation is applied to convert edges into new rectangular layers Ae with minimal width of wa (1004). A part of a perimeter of interest is calculated by building Ae layers of the given wa (1006). Space g between the edges of polygons in the same conductive layer is then found (1008). A Boolean AND operation between Ae layers, FR and the conductive layers is applied (1010), and new layers obtained that define the structure of coupling capacitors Cc and fringe capacitors Cf (1012). Next, for every found structure of the capacitors listed above the width and, using frames, space to the neighboring parallel edge of polygon in the central layer are calculated (1014). Using a Process Specification document, provided by a foundry, corresponding coefficients for the applied models of parasitic capacitances are pre-calculated (1016). Finally, an array of those coefficients as variables are written or saved to an extraction (CX) rule deck (1018).

In an example basic configuration, a computing device used as data collection device or to execute the physical verification service may include one or more processors and a system memory. A memory bus may be used to communicate between the processor and the system memory. Depending on the desired configuration, the processor may be of any type, including but not limited to a microprocessor (μP), a microcontroller (μE), a digital signal processor (DSP), or any combination thereof. The processor may include one or more levels of caching, such as a cache memory, a processor proximal, and registers. The example processor proximal may include an arithmetic logic unit (ALU), a floating point unit (FPU), a digital signal processing proximal (DSP proximal), or any combination thereof. An example memory controller may also be used with the processor, or in some implementations, the memory controller may be an internal part of the processor.

Depending on the desired configuration, the system memory may be of any type including but not limited to volatile memory (such as RAM), non-volatile memory (such as ROM, flash memory, etc.) or any combination thereof. The system memory may include an operating system, a data collection application, optionally an analysis application, and program data. The data collection application may receive circuit layout information. The optional analysis application may perform the physical verification analysis based on the received data. Alternatively, the collected data may be sent to a server for analysis by the service.

The computing device may have additional features or functionality, and additional interfaces to facilitate communications between the basic configuration and any desired devices and interfaces. For example, a bus/interface controller may be used to facilitate communications between the basic configuration and one or more data storage devices via a storage interface bus. The data storage devices may be one or more removable storage devices, one or more non-removable storage devices, or a combination thereof. Examples of the removable storage and the non-removable storage devices include magnetic disk devices such as flexible disk drives and hard-disk drives (HDDs), optical disk drives such as compact disc (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

The system memory, the removable storage devices and the non-removable storage devices are examples of computer storage media. Computer storage media includes, but is not limited to, RAM, ROM, EEPROM, flash memory or other memory technology, CD-ROM, DVDs, SSDs, or other optical storage, magnetic cassettes, magnetic tape, magnetic disk storage or other magnetic storage devices, or any other medium which may be used to store the desired information and which may be accessed by the computing device. Any such computer storage media may be part of the computing device.

The computing device may also include an interface bus for facilitating communication from various interface devices (e.g., one or more output devices, one or more peripheral interfaces, and one or more communication devices) to the basic configuration via the bus/interface controller. Some of the example output devices include a graphics processing unit and an audio processing unit, which may be configured to communicate to various external devices such as a display or speakers via one or more A/V ports. One or more example peripheral interfaces may include a serial interface controller or a parallel interface controller, which may be configured to communicate with external devices such as input devices (e.g., keyboard, mouse, pen, voice input device, touch input device, etc.) or other peripheral devices (e.g., printer, scanner, etc.) via one or more I/O ports. An example communication device includes a network controller, which may be arranged to facilitate communications with one or more other computing devices over a network communication link via one or more communication ports. The one or more other computing devices may include servers, processing system controllers, and comparable devices.

The network communication link may be one example of a communication media. Communication media may be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include non-transitory storage media.

The computing devices may be implemented as a part of a specialized server, mainframe, or similar computer that includes any of the above functions. The computing device may also be implemented as a personal computer including both laptop computer and non-laptop computer configurations.

The operations included in the example processes herein are for illustration purposes. Physical verification with herein mentioned features may be implemented by similar processes with fewer or additional operations, as well as in different order of operations using the principles described herein. The operations described herein may be executed by one or more processors operated on one or more devices, one or more processor proximals, and/or specialized processing devices, among other examples.

There are various vehicles by which processes and/or systems and/or other technologies described herein may be affected (e.g., hardware, software, and/or firmware), and the preferred vehicle will vary with the context in which the processes and/or systems and/or other technologies are deployed. For example, if an implementer determines that speed and accuracy are paramount, the implementer may opt for mainly hardware and/or firmware vehicle; if flexibility is paramount, the implementer may opt for mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via application specific integrated circuits (ASICs), field programmable gate arrays (FPGAs), digital signal processors (DSPs), or other integrated formats. However, some aspects of the embodiments disclosed herein, in whole or in part, may be equivalently implemented in integrated circuits, as one or more computer programs executing on one or more computers (e.g., as one or more programs executing on one or more computer systems), as one or more programs executing on one or more processors (e.g., as one or more programs executing on one or more microprocessors), as firmware, or as virtually any combination thereof, and that designing the circuitry and/or writing the code for the software and/or firmware are possible in light of this disclosure.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible from the foregoing descriptions. Such modifications and variations are intended to fall within the scope of the appended claims. The present disclosure is to be limited only by the terms of the appended claims, along with the full scope of equivalents to which such claims are entitled. The terminology used herein is for the purpose of describing particular embodiments only and is not intended to be limiting.

In addition, the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a HDD, a CD, a DVD, a digital tape, a computer memory, a SSD, etc.; and a transmission type medium such as a digital and/or an analog communication medium (e.g., a fiber optic cable, a waveguide, a wired communication link, a wireless communication link, etc.).

It is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. A data processing system may include one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors.

A data processing system may be implemented utilizing any suitable commercially available components, such as those found in data computing/communication and/or network computing/communication systems. The herein described subject matter sometimes illustrates different components contained within, or connected with, different other components. Such depicted architectures are merely exemplary, and in fact, many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

For any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A method for physical verification of workflow for semiconductor circuit designs, the method comprising:
    splitting an integrated circuit (IC) layout into a number of windows for parallel processing using a plurality of central processing cores;
    for each window:
        extracting parasitic capacitance structures from the IC layout;
        generating fill elements for masks to fabricate an IC having the IC layout using a metadata matrix to minimize volume of information and resources needed; and
        extracting parasitic resistance structures from the IC layout.

2. The method of claim 1 wherein splitting the IC layout into a number of windows for parallel processing using a plurality of central processing cores comprises logically dividing the IC layout into a number of strips, and executing a number of input rule blocks for each strip using a separate one of the a plurality of central processing cores.

3. The method of claim 2 wherein dividing the IC layout into a number of strips comprises:

checking if strip processing is applicable for the input rule blocks;
dividing the IC layout into overlapping strips by a value of a design constraint;
initiating a dedicated verification process for each of the number of strips;
filtering out violations found on upper and lower sides of the number of strips; and
gathering filtered out violations and marking them as false solutions.

4. The method of claim 1 further comprising prior to extracting parasitic capacitance structures from the IC layout splitting the IC layout for parallel processing using the plurality of central processing cores based on a number of groups of rules.

5. The method of claim 4 wherein splitting the IC layout for parallel processing using the plurality of central processing cores based on a number of groups of rules comprises:
    ordering input rules for processing using a single one of the plurality of central processing cores;
    identifying input rules needing identification of connectivity to connect clusters in IC layout;
    forming first rule blocks of input rules needing connectivity and exclude the first rule blocks from further processing;
    identifying input rules that are run in flat mode only;
    forming second rule blocks of input rules run in flat mode only and exclude them from further processing; and
    dividing remaining input rules into a number of third rule blocks having similar processing time.

6. The method of claim 5 wherein the processing time of the third rule blocks is based on a number of layers in the IC layout, complexity of the number of layers, and a number of vertices in the number of layers.

7. A method for physical verification of workflow for semiconductor circuit designs, the method comprising:
    splitting an integrated circuit (IC) layout into a number of windows for parallel processing using a plurality of central processing cores;
    extracting parasitic capacitance structures from the IC layout;
    generating fill elements for masks to fabricate an IC having the IC layout using a metadata matrix to minimize volume of information and resources needed; and
    extracting parasitic resistance structures from the IC layout.

8. The method of claim 7 wherein splitting the IC layout into a number of windows for parallel processing using a plurality of central processing cores comprises logically dividing the IC layout into a number of strips, and executing a number of input rule blocks for each strip using separate one of the a plurality of central processing cores.

9. The method of claim 8 wherein dividing the IC layout into a number of strips comprises:
    checking if strip processing is applicable for the input rule blocks;
    dividing the IC layout into overlapping strips by a value of a design constraint;
    initiating a dedicated verification process for each of the number of strips;
    filtering out violations found on upper and lower sides of the number of strips; and
    gathering filtered out violations and marking them as false solutions.

10. The method of claim 7 further comprising prior to extracting parasitic capacitance structures from the IC layout splitting the IC layout for parallel processing using the plurality of central processing cores based on a number of groups of rules.

11. The method of claim 10 wherein splitting the IC layout for parallel processing using the plurality of central processing cores based on a number of groups of rules comprises:
ordering input rules for processing using a single one of the plurality of central processing cores;
identifying input rules needing identification of connectivity to connect clusters in IC layout;
forming first rule blocks of input rules needing connectivity and exclude the first rule blocks from further processing;
identifying input rules that are run in flat mode only;
forming second rule blocks of input rules run in flat mode only and exclude them from further processing; and
dividing remaining input rules into a number of third rule blocks having similar processing time.

12. The method of claim 11 wherein the processing time of the third rule blocks is based on a number of layers in the IC layout, complexity of the number of layers, and a number of vertices in the number of layers.

13. A system for physical verification of a semiconductor circuit design, the system comprising:
a computing device including a plurality of central processing cores;
electronic design automation (EDA) tool operable to run on the computing device, the EDA tool including:
a splitting module operable to split an integrated circuit (IC) layout into a number of windows for parallel processing using a plurality of central processing cores;
a parasitic capacitance module operable to extract for each window parasitic capacitance structures from the IC layout;
a fill element module operable to generate for each window fill elements for masks to fabricate an IC having the IC layout using a metadata matrix to minimize volume of information and resources needed; and

22 a parasitic resistance module operable to extract for each window parasitic resistance structures from the IC layout.

14. The system of claim 13 wherein the splitting module is operable to:
checking if strip processing is applicable for input rule blocks input to the system;
split the IC layout into overlapping strips by a value of a design constraint;
initiating a dedicated verification process for each of a number of strips;
filtering out violations found on upper and lower sides of the number of strips; and
gathering filtered out violations and marking them as false solutions.

15. The system of claim 13 wherein the EDA tool further comprises a groups of rules module operable to splitting the IC layout into a number of groups of rules for parallel processing using the plurality of central processing cores.

16. The system of claim 15 wherein the groups of rules module is operable to:
order input rules for processing using a single one of the plurality of central processing cores;
identify input rules needing identification of connectivity to connect clusters in IC layout;
form first rule blocks of input rules needing connectivity and exclude the first rule blocks from further processing;
identify input rules that are run in flat mode only;
forming second rule blocks of input rules run in flat mode only and exclude them from further processing; and
divide remaining input rules into a number of third rule blocks having similar processing time.

17. The system of claim 16 wherein the processing time of the third rule blocks is based on a number of layers in the IC layout, complexity of the number of layers, and a number of vertices in the number of layers.

* * * * *